(12) United States Patent
Jones

(10) Patent No.: US 7,077,917 B2
(45) Date of Patent: Jul. 18, 2006

(54) HIGH-PRESSURE PROCESSING CHAMBER FOR A SEMICONDUCTOR WAFER

(75) Inventor: William Dale Jones, Phoenix, AZ (US)

(73) Assignee: Tokyo Electric Limited, Tokyo (JP)

( * ) Notice: Subject to any disclaimer, the term of this patent is extended or adjusted under 35 U.S.C. 154(b) by 144 days.

(21) Appl. No.: 10/364,284

(22) Filed: Feb. 10, 2003

(65) Prior Publication Data
US 2004/0157463 A1 Aug. 12, 2004

(51) Int. Cl.
*B08B 3/02* (2006.01)
(52) U.S. Cl. .................... 134/34; 134/42; 134/200; 134/902
(58) Field of Classification Search .......... 134/2, 134/34, 42, 200, 902, 199, 182, 183
See application file for complete search history.

(56) References Cited

U.S. PATENT DOCUMENTS

| | | | |
|---|---|---|---|
| 2,617,719 A | 11/1952 | Stewart | |
| 2,618,930 A * | 11/1952 | Quinn | 60/477 |
| 2,625,886 A | 1/1953 | Browne | |
| 2,873,597 A * | 2/1959 | Fahringer | 68/5 E |
| 3,521,765 A | 7/1970 | Kauffman et al. | |
| 3,623,627 A | 11/1971 | Bolton | 220/41 |
| 3,681,171 A * | 8/1972 | Hojo et al. | 156/382 |
| 3,689,025 A | 9/1972 | Kiser | |
| 3,744,660 A | 7/1973 | Galnes et al. | |
| 3,788,395 A * | 1/1974 | Knoos et al. | 165/169 |
| 3,968,885 A | 7/1976 | Hassan et al. | |
| 4,029,517 A | 6/1977 | Rand | |
| 4,091,643 A | 5/1978 | Zucchini | |
| 4,245,154 A | 1/1981 | Uehara et al. | |
| 4,341,592 A | 7/1982 | Shortes et al. | |
| 4,355,937 A | 10/1982 | Mack et al. | |
| 4,367,140 A | 1/1983 | Wilson | |
| 4,391,511 A | 7/1983 | Akiyama et al. | |
| 4,406,596 A | 9/1983 | Budde | |
| 4,422,651 A | 12/1983 | Platts | |
| 4,426,358 A | 1/1984 | Johnansson | 422/112 |
| 4,474,199 A | 10/1984 | Blaudszun | |
| 4,522,788 A | 6/1985 | Sitek et al. | |

(Continued)

FOREIGN PATENT DOCUMENTS

CH SE 251213 8/1948

(Continued)

OTHER PUBLICATIONS

Hideaki Itakura et al., "Multi-Chamber Dry Etching System", Solid State Technology, Apr. 1982, pp. 209-214.

(Continued)

*Primary Examiner*—Frankie L. Stinson
(74) *Attorney, Agent, or Firm*—Haverstock & Owens LLP

(57) ABSTRACT

A processing chamber having an improved sealing means is disclosed. The processing chamber comprises a lower element, an upper element, and a sealing means that tightly holds the lower element to the upper element to define a processing volume that is maintained using the minimum pressure necessary. The processing chamber comprises a plate having a first face that forms the processing volume and a second, opposing face that forms a seal-energizing cavity. In one embodiment, a surface area of the first face is smaller than a surface area of the second face. When the same pressure is applied against both the first face and the second face, the force on the second face is greater than the force on the first face, resulting in a sealing force exceeding a processing force generated within the processing volume.

21 Claims, 11 Drawing Sheets

U.S. PATENT DOCUMENTS

| | | | |
|---|---|---|---|
| 4,549,467 A | 10/1985 | Wilden et al. | |
| 4,574,184 A | 3/1986 | Wolf et al. | 219/440 |
| 4,592,306 A | 6/1986 | Gallego | |
| 4,601,181 A | 7/1986 | Privat | |
| 4,626,509 A | 12/1986 | Lyman | |
| 4,670,126 A | 6/1987 | Messer et al. | |
| 4,682,937 A | 7/1987 | Credle, Jr. | |
| 4,693,777 A | 9/1987 | Hazano et al. | |
| 4,749,440 A | 6/1988 | Blackwood et al. | |
| 4,778,356 A | 10/1988 | Hicks | |
| 4,788,043 A | 11/1988 | Kagiyama et al. | |
| 4,789,077 A | 12/1988 | Noe | |
| 4,823,976 A | 4/1989 | White, III et al. | |
| 4,825,808 A | 5/1989 | Takahashi et al. | |
| 4,827,867 A * | 5/1989 | Takei et al. | 118/64 |
| 4,838,476 A | 6/1989 | Rahn | |
| 4,865,061 A | 9/1989 | Fowler et al. | |
| 4,879,431 A | 11/1989 | Bertoncini | |
| 4,917,556 A | 4/1990 | Stark et al. | |
| 4,924,892 A | 5/1990 | Kiba et al. | |
| 4,951,601 A | 8/1990 | Maydan et al. | |
| 4,960,140 A | 10/1990 | Ishijima et al. | |
| 4,983,223 A | 1/1991 | Gessner | |
| 5,001,866 A * | 3/1991 | Powell et al. | 49/477.1 |
| 5,009,738 A * | 4/1991 | Gruenwald et al. | 156/345.47 |
| 5,011,542 A | 4/1991 | Weil | |
| 5,044,871 A | 9/1991 | Davis et al. | |
| 5,062,770 A | 11/1991 | Story et al. | |
| 5,071,485 A | 12/1991 | Matthews et al. | |
| 5,105,556 A | 4/1992 | Kurokawa et al. | |
| 5,143,103 A | 9/1992 | Basso et al. | |
| 5,167,716 A | 12/1992 | Boitnott et al. | |
| 5,169,296 A | 12/1992 | Wilden | |
| 5,169,408 A * | 12/1992 | Biggerstaff et al. | 29/25.01 |
| 5,185,296 A | 2/1993 | Morita et al. | |
| 5,186,594 A | 2/1993 | Toshima et al. | |
| 5,186,718 A | 2/1993 | Tepman et al. | |
| 5,188,515 A | 2/1993 | Horn | |
| 5,190,373 A | 3/1993 | Dickson et al. | |
| 5,191,993 A | 3/1993 | Wanger et al. | |
| 5,193,560 A | 3/1993 | Tanaka et al. | |
| 5,195,878 A | 3/1993 | Sahiavo et al. | |
| 5,213,485 A | 5/1993 | Wilden | |
| 5,217,043 A | 6/1993 | Novakovi | |
| 5,221,019 A | 6/1993 | Pechacek | |
| 5,222,876 A | 6/1993 | Budde | |
| 5,224,504 A | 7/1993 | Thompson et al. | |
| 5,236,669 A | 8/1993 | Simmons et al. | |
| 5,237,824 A | 8/1993 | Pawliszyn | |
| 5,240,390 A | 8/1993 | Kvinge et al. | |
| 5,243,821 A | 9/1993 | Schuck et al. | |
| 5,246,500 A | 9/1993 | Samata et al. | |
| 5,251,776 A | 10/1993 | Morgan, Jr. et al. | |
| 5,267,455 A | 12/1993 | Dewees et al. | |
| 5,280,693 A | 1/1994 | Heudecker | |
| 5,285,352 A | 2/1994 | Pastore et al. | |
| 5,288,333 A | 2/1994 | Tanaka et al. | |
| 5,306,350 A | 4/1994 | Hoy et al. | |
| 5,313,965 A | 5/1994 | Palen | |
| 5,314,574 A * | 5/1994 | Takahashi | 438/706 |
| 5,328,722 A | 7/1994 | Ghanayem et al. | |
| 5,337,446 A | 8/1994 | Smith et al. | |
| 5,339,844 A | 8/1994 | Stanford, Jr. et al. | |
| 5,355,901 A * | 10/1994 | Mielnik et al. | 134/105 |
| 5,368,171 A | 11/1994 | Jackson | |
| 5,370,741 A | 12/1994 | Bergman | |
| 5,374,829 A | 12/1994 | Sakamoto et al. | 250/453.11 |
| 5,377,705 A | 1/1995 | Smith, Jr. et al. | |
| 5,401,322 A | 3/1995 | Marshall | |
| 5,404,894 A | 4/1995 | Shiraiwa | |
| 5,412,958 A | 5/1995 | Iliff et al. | |
| 5,417,768 A | 5/1995 | Smith, Jr. et al. | |
| 5,433,334 A | 7/1995 | Reneau | |
| 5,447,294 A | 9/1995 | Sakata et al. | |
| 5,474,410 A | 12/1995 | Ozawa et al. | 414/217 |
| 5,494,526 A | 2/1996 | Paranjpe | |
| 5,503,176 A | 4/1996 | Dunmire et al. | |
| 5,505,219 A | 4/1996 | Lansberry et al. | |
| 5,509,431 A | 4/1996 | Smith, Jr. et al. | |
| 5,526,834 A | 6/1996 | Mielnik et al. | |
| 5,533,538 A | 7/1996 | Marshall | |
| 5,571,330 A | 11/1996 | Kyogoku | |
| 5,589,224 A | 12/1996 | Tepman et al. | |
| 5,621,982 A | 4/1997 | Yamashita et al. | |
| 5,622,678 A * | 4/1997 | Hiltawsky et al. | 422/295 |
| 5,629,918 A | 5/1997 | Ho et al. | |
| 5,644,855 A | 7/1997 | McDermott et al. | |
| 5,649,809 A | 7/1997 | Stapelfeldt | |
| 5,656,097 A | 8/1997 | Olesen et al. | |
| 5,658,610 A * | 8/1997 | Bergman et al. | 426/665 |
| 5,669,251 A | 9/1997 | Townsend et al. | |
| 5,672,204 A | 9/1997 | Habuka | 117/204 |
| 5,679,169 A | 10/1997 | Gonzales et al. | |
| 5,702,228 A | 12/1997 | Tamai et al. | |
| 5,706,319 A | 1/1998 | Holtz | |
| 5,728,425 A * | 3/1998 | Ebe et al. | 427/248.1 |
| 5,746,008 A | 5/1998 | Yamashita et al. | |
| 5,769,588 A | 6/1998 | Toshima et al. | |
| 5,772,783 A | 6/1998 | Stucker | |
| 5,797,719 A | 8/1998 | James et al. | |
| 5,798,126 A | 8/1998 | Fujikawa et al. | |
| 5,817,178 A | 10/1998 | Mita et al. | 118/666 |
| 5,850,747 A | 12/1998 | Roberts et al. | |
| 5,858,107 A | 1/1999 | Chao et al. | |
| 5,879,459 A | 3/1999 | Gadgil et al. | 118/715 |
| 5,881,577 A | 3/1999 | Sauer et al. | |
| 5,882,165 A | 3/1999 | Maydan et al. | |
| 5,888,050 A | 3/1999 | Fitzgerald et al. | |
| 5,898,727 A | 4/1999 | Fujikawa et al. | |
| 5,900,107 A | 5/1999 | Murphy et al. | |
| 5,904,737 A | 5/1999 | Preston et al. | |
| 5,906,866 A | 5/1999 | Webb | |
| 5,928,389 A | 7/1999 | Jevtic | |
| 5,932,100 A | 8/1999 | Yager et al. | |
| 5,934,856 A | 8/1999 | Asakawa et al. | |
| 5,934,991 A | 8/1999 | Rush | |
| 5,943,721 A | 8/1999 | Lerette et al. | |
| 5,946,945 A | 9/1999 | Kegler et al. | |
| 5,970,554 A | 10/1999 | Shore et al. | |
| 5,975,492 A | 11/1999 | Brenes | |
| 5,979,306 A | 11/1999 | Fujikawa et al. | |
| 5,980,648 A | 11/1999 | Adler | |
| 5,981,399 A | 11/1999 | Kawamura et al. | |
| 5,989,342 A | 11/1999 | Ikeda et al. | |
| 6,005,226 A | 12/1999 | Aschner et al. | |
| 6,014,879 A * | 1/2000 | Jaekel et al. | 72/61 |
| 6,017,820 A | 1/2000 | Ting et al. | |
| 6,021,791 A | 2/2000 | Dryer et al. | |
| 6,029,371 A | 2/2000 | Kamikawa et al. | |
| 6,035,871 A | 3/2000 | Eui-Yeol | |
| 6,037,277 A | 3/2000 | Masakara et al. | |
| 6,048,494 A | 4/2000 | Annapragada | 422/33 |
| 6,053,348 A | 4/2000 | Morch | |
| 6,056,008 A | 5/2000 | Adams et al. | |
| 6,062,853 A | 5/2000 | Shimazu et al. | 432/258 |
| 6,067,728 A | 5/2000 | Farmer et al. | |
| 6,070,440 A | 6/2000 | Malchow et al. | |
| 6,077,053 A | 6/2000 | Fujikawa et al. | |
| 6,077,321 A | 6/2000 | Adachi et al. | |
| 6,082,150 A | 7/2000 | Stucker | |
| 6,085,935 A | 7/2000 | Malchow et al. | |
| 6,089,377 A | 7/2000 | Shimizu | 206/711 |
| 6,097,015 A | 8/2000 | McCullough et al. | |
| 6,109,296 A | 8/2000 | Austin | |

| | | |
|---|---|---|
| 6,122,566 A | 9/2000 | Nguyen et al. |
| 6,128,830 A | 10/2000 | Bettcher et al. |
| 6,145,519 A | 11/2000 | Konishi et al. |
| 6,159,295 A | 12/2000 | Maskara et al. |
| 6,164,297 A | 12/2000 | Kamikawa |
| 6,186,722 B1 | 2/2001 | Shirai |
| 6,203,582 B1 | 3/2001 | Berner et al. |
| 6,216,364 B1 | 4/2001 | Tanaka et al. |
| 6,221,781 B1 * | 4/2001 | Siefering et al. ............ 438/704 |
| 6,228,563 B1 | 5/2001 | Starov et al. |
| 6,235,634 B1 | 5/2001 | White et al. |
| 6,239,038 B1 | 5/2001 | Wen |
| 6,241,825 B1 | 6/2001 | Wytman |
| 6,244,121 B1 | 6/2001 | Hunter |
| 6,251,250 B1 | 6/2001 | Keigler |
| 6,264,753 B1 | 7/2001 | Chao et al. |
| 6,277,753 B1 | 8/2001 | Mullee et al. |
| 6,286,231 B1 | 9/2001 | Bergman et al. |
| 6,305,677 B1 | 10/2001 | Lenz |
| 6,306,564 B1 * | 10/2001 | Mullee ........................ 430/329 |
| 6,319,858 B1 | 11/2001 | Lee et al. .................... 438/787 |
| 6,333,268 B1 | 12/2001 | Starov et al. |
| 6,334,266 B1 * | 1/2002 | Moritz et al. .................. 34/337 |
| 6,344,174 B1 | 2/2002 | Miller et al. |
| 6,355,072 B1 | 3/2002 | Racette et al. |
| 6,388,317 B1 | 5/2002 | Reese |
| 6,389,677 B1 | 5/2002 | Lenz |
| 6,406,782 B1 | 6/2002 | Johnson et al. .......... 428/317.7 |
| 6,418,956 B1 | 7/2002 | Bloom |
| 6,436,824 B1 | 8/2002 | Chooi et al. |
| 6,454,519 B1 | 9/2002 | Toshima et al. |
| 6,454,945 B1 | 9/2002 | Weigl et al. |
| 6,464,790 B1 | 10/2002 | Sherstinsky et al. |
| 6,465,403 B1 | 10/2002 | Skee |
| 6,497,239 B1 * | 12/2002 | Farmer et al. ............. 134/56 R |
| 6,508,259 B1 | 1/2003 | Tseronis et al. ............ 134/105 |
| 6,509,141 B1 | 1/2003 | Mullee |
| 6,521,466 B1 | 2/2003 | Castrucci |
| 6,541,278 B1 | 4/2003 | Morita et al. |
| 6,546,946 B1 | 4/2003 | Dunmire |
| 6,550,484 B1 | 4/2003 | Gopinath et al. |
| 6,558,475 B1 | 5/2003 | Jur et al. |
| 6,561,213 B1 | 5/2003 | Wang et al. |
| 6,561,220 B1 | 5/2003 | McCullough et al. |
| 6,561,481 B1 | 5/2003 | Filonczuk |
| 6,561,767 B1 | 5/2003 | Berger et al. |
| 6,564,826 B1 | 5/2003 | Shen |
| 6,596,093 B1 | 7/2003 | DeYoung et al. |
| 6,612,317 B1 | 9/2003 | Costantini et al. |
| 6,635,565 B1 | 10/2003 | Wu et al. |
| 6,641,678 B1 | 11/2003 | DeYoung et al. |
| 6,722,642 B1 | 4/2004 | Sutton et al. |
| 6,736,149 B1 | 5/2004 | Biberger et al. |
| 6,764,552 B1 | 7/2004 | Joyce et al. |
| 6,766,810 B1 * | 7/2004 | Van Cleemput ............. 134/1.3 |
| 6,805,801 B1 | 10/2004 | Humayun et al. |
| 6,851,148 B1 | 2/2005 | Preston et al. |
| 6,874,513 B1 | 4/2005 | Yamagata et al. |
| 6,921,456 B1 | 7/2005 | Biberger et al. |
| 2001/0050096 A1 | 12/2001 | Constantini et al. ...... 134/58 R |
| 2002/0001929 A1 | 1/2002 | Biberger et al. |
| 2002/0046707 A1 | 4/2002 | Biberger et al. |
| 2002/0189543 A1 | 12/2002 | Biberger et al. |
| 2003/0005948 A1 * | 1/2003 | Matsuno et al. .............. 134/33 |
| 2003/0051741 A1 | 3/2003 | DeSimone et al. |
| 2003/0196679 A1 | 10/2003 | Cotte et al. |
| 2003/0205510 A1 | 11/2003 | Jackson |
| 2004/0020518 A1 | 2/2004 | DeYoung et al. |
| 2004/0157463 A1 | 8/2004 | Jones |
| 2005/0014370 A1 | 1/2005 | Jones |

FOREIGN PATENT DOCUMENTS

| | | |
|---|---|---|
| CN | 1399790 A | 2/2003 |
| DE | 36 08 783 A1 | 9/1987 |
| DE | 198 60 084 A1 | 7/2000 |
| EP | 0 244 951 A2 | 11/1987 |
| EP | 0 272 141 A2 | 6/1988 |
| EP | 0 453 867 A1 | 10/1991 |
| EP | 0 572 913 A1 | 12/1993 |
| EP | 0 587 168 A1 | 3/1994 |
| EP | 0 679 753 B1 | 11/1995 |
| EP | 0 903 775 A2 | 3/1999 |
| FR | 1.449.491 | 9/1967 |
| GB | 2 003 975 | 3/1979 |
| GB | 2 193 482 | 2/1988 |
| JP | 56-142629 | 11/1981 |
| JP | 60-238479 | 11/1985 |
| JP | 60-246635 | 12/1985 |
| JP | 61-017151 | 1/1986 |
| JP | 61-231166 | 10/1986 |
| JP | 62-111442 | 5/1987 |
| JP | 62-125619 | 6/1987 |
| JP | 63-256326 | 10/1988 |
| JP | 63-303059 | 12/1988 |
| JP | 2-148841 | 6/1990 |
| JP | 2-209729 | 8/1990 |
| JP | 4-284648 | 10/1992 |
| JP | 40 5283511 A | 10/1993 |
| JP | 8-186140 | 7/1996 |
| JP | 8-206485 | 8/1996 |
| JP | 10-144757 | 5/1998 |
| JP | 10-335408 | 12/1998 |
| JP | 11-200035 | 7/1999 |
| JP | 2000/106358 | 4/2000 |
| JP | 2001-15582 * | 1/2001 |
| JP | 2001-77074 | 3/2001 |
| WO | WO 87/07309 | 12/1987 |
| WO | WO 91/12629 | 8/1991 |
| WO | WO 99/18603 | 4/1999 |
| WO | WO 00/36635 | 6/2000 |
| WO | WO 01/10733 A1 | 2/2001 |
| WO | WO 01/33615 A3 | 5/2001 |
| WO | WO 01/55628 A1 | 8/2001 |
| WO | WO 01/68279 A2 | 9/2001 |
| WO | WO 01/74538 A1 | 10/2001 |
| WO | WO 01/78911 A1 | 10/2001 |
| WO | WO 01/85391 A2 | 11/2001 |
| WO | WO 01/94782 A3 | 12/2001 |
| WO | WO 02/16051 A2 | 2/2002 |
| WO | WO 03/030219 A2 | 10/2003 |

OTHER PUBLICATIONS

Sun, Y.P. et al., "Preparation of Polymer-Protected Semiconductor Nanoparticles Through the Rapid Expansion of Supercritical Fluid Solution," Chemical Physics Letters, pp. 585-588, May 22, 1998.

Dahmen, N. et al., "Supercritical Fluid Extraction of Grinding and Metal Cutting Waste Contaminated with Oils," Supercritical Fluids—Extraction and Pollution Prevention, ACS Symposium Series, vol. 670, pp. 270-279, Oct. 21, 1997.

Xu, C. et al., "Submicron-Sized Spherical Yttrium Oxide Based Phosphors Prepared by Supercritical CO2-Assisted aerosolization and pyrolysis," Appl. Phys. Lett., vol. 71, No. 12, Sep. 22, 1997, pp. 1643-1645.

Courtecuisse, V.G. et al., "Kinetics of the Titanium Isopropoxide Decomposition in Supercritical Isopropyl Alcohol," Ind. Eng. Chem. Res., vol. 35, No. 8, pp. 2539-2545, Aug. 1996.

Gallagher-Wetmore, P. et al., "Supercritical Fluid Processing: A New Dry Technique for Photoresist Developing," SPIE vol. 2438, pp. 694-708, Jun. 1995.

McHardy, J. et al., "Progress in Supercritical CO2 Cleaning," SAMPE Jour., vol. 29, No. 5, pp. 20-27, Sep. 1993.

Purtell, R, et al., "Precision Parts Cleaning using Supercritical Fluids," J. Vac, Sci, Technol. A. vol. 11, No. 4, Jul. 1993, pp. 1696-1701.

Hansen, B.N. et al., "Supercritical Fluid Transport—Chemical Deposition of Films,"Chem. Mater., vol. 4, No. 4, pp. 749-752, 1992.

Hybertson, B.M. et al., "Deposition of Palladium Films by a Novel Supercritical Fluid Transport Chemical Deposition Process," Mat. Res. Bull., vol. 26, pp. 1127-1133, 1991.

Ziger, D. H. et al., "Compressed Fluid Technology: Application to RIE-Developed Resists," AiChE Jour., vol. 33, No. 10, pp. 1585-1591, Oct. 1987.

Matson, D.W. et al., "Rapid Expansion of Supercritical Fluid Solutions: Solute Formation of Powders, Thin Films, and Fibers," Ind. Eng. Chem. Res., vol. 26, No. 11, pp. 2298-2306, 1987.

Tolley, W.K. et al., "Stripping Organics from Metal and Mineral Surfaces using Supercritical Fluids," Separation Science and Technology, vol. 22, pp. 1087-1101, 1987.

Joseph L. Foszcz, "Diaphragm Pumps Eliminate Seal Problems", Plant Engineering, pp. 1-5, Feb. 1, 1996.

Bob Agnew, "WILDEN Air-Operated Diaphragm Pumps", Process & Industrial Training Technologies, Inc., 1996.

* cited by examiner

Fig. 9

HIGH-PRESSURE PROCESSING CHAMBER FOR A SEMICONDUCTOR WAFER

FIELD OF THE INVENTION

This invention relates to the field of processing chambers. More particularly, this invention relates to a system and a method for reliably sealing a high-pressure processing chamber.

BACKGROUND OF THE INVENTION

A semiconductor device is fabricated by placing it in a processing chamber in which device layers are formed, processing residue is removed, and other processing steps are performed on it. In addition, certain processing chambers are used for cleaning semiconductor wafers at supercritical temperatures and pressures.

Generally, processing chambers contain an upper element and a lower element. When the two elements are brought together, they form a processing volume in which a wafer is contained during processing. During processing, it is critical that the processing volume remain sealed so that it can be maintained at correct operating conditions, such as high-pressure, atmospheric, or supercritical conditions. Sealing the processing volume from the outside environment also ensures that (a) the processed wafer is not exposed to contaminants, making it unusable, and (b) processing materials, such as harmful chemicals, introduced into the processing volume are not released to the surroundings.

A processing volume is maintained by applying a sealing force to counteract a processing force generated within the processing volume while the wafer is being processed. The processing force acts to force the upper element and the lower element apart, opening the processing volume seal and breaking the processing volume. The sealing force may be produced by a hydraulic piston. To ensure that the processing volume is maintained regardless of the processing force, before the workpiece is processed the sealing force is set to the largest attainable processing force. The sealing force remains at this level even if the largest attainable processing force is never reached or is reached for only a small portion of the entire processing cycle.

Such processing chambers have several disadvantages. First, sealing components that bear the highest attainable sealing force for an unnecessary length of time are prone to failure after repeated applications of the sealing force. Second, the large contact forces on the sealing face produce particulates that are introduced into the processing volume and contaminate the wafer. Third, the equipment used to pressurize the hydraulic fluids adds costs to the processing system, since the equipment is used to seal the processing chamber and not to process a wafer. Fourth, those systems that could be designed to replace hydraulic components with supercritical components using supercritical processing materials are expensive. These systems require complicated recycling techniques because the supercritical processing materials must be expanded and pressurized before they can be reused.

Accordingly, what is needed is a processing system that (1) does not require a continuous excessive sealing force to maintain a processing volume, (2) reduces the number of contaminants that may be introduced into the processing volume, (3) uses elements already used in processing for maintaining the processing volume seal, and (4) uses a small energizing volume so that the processing system is compact and operates more efficiently.

BRIEF SUMMARY OF THE INVENTION

Embodiments of the present invention include a semiconductor processing system that maintains a processing volume using a floating, and thus optimal, sealing pressure to create a sealing force. The semiconductor processing system comprises an upper element, a lower element, and a sealing means. The sealing means brings the upper element and the lower element together to create a processing volume seal, thus defining a processing volume within which a semiconductor wafer or other workpiece can be processed. The processing volume seal is maintained tightly by generating a sealing force in a seal-energizing cavity to counterbalance a processing force generated within the processing volume.

In one embodiment of the present invention, the processing volume seal is maintained by a plate contained within one of the upper element and the lower element. A first face of the plate is contained within the processing volume and a second, opposing face of the plate is contained within the seal-energizing cavity. The second face has a cross-sectional area larger than a cross-sectional area of the first face. Thus when the same pressure is applied to both the first face and the second face, the force applied to the second face (the sealing force) is larger than the force applied to the first face (the processing force), maintaining the upper element against the lower element and thus maintaining the processing volume seal.

Other embodiments of the present invention comprise venting means to vent the processing volume when a processing pressure used to generate a processing force exceeds a sealing pressure used to generate a sealing force, thus aborting the device processing. This structure ensures that when the processing volume cannot be maintained, processing materials can be diverted and stored rather than dispersed to the surrounding environment.

Other embodiments of the present invention comprise a pressure intensifier, which takes a small pressure and intensifies it to produce a higher sealing pressure. The pressure intensifier thus allows the sealing pressure to be attained with a low input pressure generated within a small volume or with a low pressure relative to the processing pressure.

Other embodiments of the present invention comprise a first pressure transducer, a second pressure transducer, and an electronic controller. The first pressure transducer is coupled to the processing volume, monitors the processing pressure, and generates a related processing signal. The second pressure transducer is coupled to a low-pressure chamber used to generate the sealing pressure and thus maintain the processing volume seal. The second pressure transducer monitors the sealing pressure and generates a related sealing signal. The electronic controller receives at least one of the processing signal and the sealing signal and adjusts one of the processing pressure and the sealing pressure so that the sealing force counterbalances the processing force.

BRIEF DESCRIPTION OF THE SEVERAL VIEWS OF THE DRAWING

FIG. 9 illustrates a side cross-sectional view and schematic diagram of a processing chamber and associated valve assembly in accordance with another embodiment of the present invention.

DETAILED DESCRIPTION OF THE INVENTION

Figure 1:
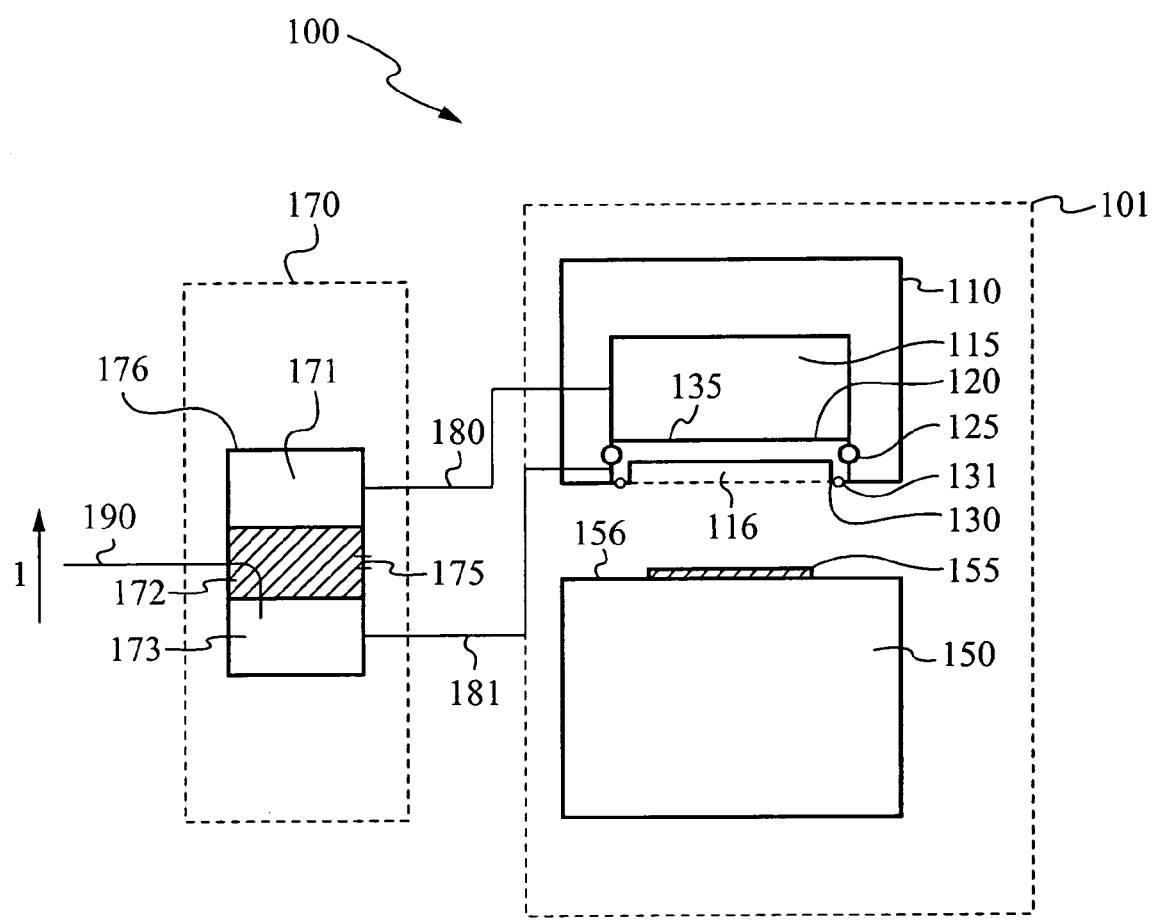
FIG. 1 illustrates a side cross-sectional view of processing system in an open position, in accordance with one embodiment of the present invention.

The present invention is directed to a system for and method of efficiently maintaining a processing volume during device processing. When a semiconductor wafer undergoes processing in a processing chamber, it is subjected to a range of processing temperatures and pressures. For the processing to be performed correctly-that is, for a semiconductor wafer to be processed without being exposed to contaminants-the processing volume must remain hermetically sealed during processing. Moreover, the processing volume should remain sealed using the minimum force necessary.

As used herein, processing pressure refers to the pressure generated within a processing volume during device processing, and accordingly may vary during device processing. Processing force refers to the force generated by the processing pressure and exerted against a face of the processing volume. Sealing pressure refers to the pressure generated within a seal-energizing cavity (described below). Sealing force refers to the force generated by the sealing pressure and exerted against a face of the seal-energizing cavity. In accordance with the present invention, the sealing force counterbalances the processing force and is used to maintain the processing volume seal. Thus, as described below, to efficiently maintain the processing volume, the sealing force must be slightly larger than the processing force. Processing refers to (a) processes performed on a semiconductor device during various stages of device fabrication including, but not limited to, cleaning, deposition, ion implantation, or any other type of processing performed on a semiconductor wafer, and (b) processes performed on devices other than semiconductor wafers. Processing materials refer to any materials used for processing within the processing volume and include, for example, HCl, $CO_2$, and supercritical $CO_2$. Processing performed while a processing volume is maintained is referred to as normal processing. Processing performed while the processing volume is not maintained is referred to as abnormal processing. Processing volume seal refers to a seal used to form the processing volume. The processing volume seal is formed by contacting surfaces of a sealing element and one of the upper element and the lower element.

Embodiments of the present invention maintain the processing volume by counterbalancing the processing pressure with the sealing pressure. By ensuring that (a) a surface area of a face of the sealing-energizing cavity is sufficiently larger than a surface area of a face of the processing volume, or (b) the sealing pressure is sufficiently greater than the processing pressure, the sealing force will be sufficiently larger than the processing force. In this way, the processing volume seal is maintained without pre-pressurizing the seal-energizing cavity with the seal pressure necessary to create a force to counteract the highest processing force. The sealing pressure is thus said to track or float with the processing pressure so that the sealing force is equal to or somewhat greater than the processing force. In this way, the forces counterbalance to maintain the processing volume seal.

Embodiments of the present invention thus reduce the wear on the contacting surfaces of the seal since the contact force of the seal face never becomes excessive. In addition, the components subjected to the counterbalancing forces do not need to be designed to withstand the total force of the sealing pressure. The components must only withstand the sealing force that exceeds the counterbalancing process force.

Embodiments of the present invention also protect against equipment damage. For example, if a workpiece or other foreign object is inadvertently positioned between the sealing surfaces, the sealing faces will not exert an inordinate force against the workpiece or other foreign object, damaging the processing equipment. By ensuring that the sealing force is small in such circumstances, the amount of damage to the processing equipment is reduced.

Embodiments of the present invention also advantageously ensure that when the sealing pressure is below a threshold, such as when the seal-energizing cavity has a leak or has not been filled with a sealing fluid, the processing volume is vented in a predetermined manner. Thus, the processing materials are not dispersed to the surrounding environment.

Furthermore, embodiments of the present invention reduce the size of a seal-energizing cavity that must be energized in order to maintain the processing volume seal. Other embodiments can reduce the size of the seal-energizing cavity because the net force acting on it is reduced since the sealing pressure balances, rather than greatly exceeds, the processing pressure. Thus, the processing volume can be maintained more efficiently.

FIG. 1 illustrates a cross-section of a processing assembly 100 in accordance with one embodiment of the present invention. FIG. 1 illustrates the processing assembly 100 in an open position, in which a semiconductor wafer can be inserted or removed from the processing assembly 100 as described below. The processing assembly 100 comprises a balancing cylinder 170 coupled to a processing chamber 101. As described in more detail below, the balancing cylinder 170 ensures both that (a) during normal processing, the processing volume 140 is securely sealed (i.e., is maintained) and (b) when a critical pressure is not maintained in a seal-energizing cavity, the processing chamber 101 is vented so that processing is suspended.

The balancing cylinder 170 comprises a piston 172, which divides a cylinder cavity into an upper reservoir 171 and a lower reservoir 173. The housing 176 of the piston 172 has a vent hole 175. Thus, when the piston 172 is slid a sufficient distance in the direction denoted by the arrow 1 in FIG. 1, the vent hole 175 is located in the lower reservoir 173 so that the lower reservoir 173 is vented through the vent hole 175. The upper reservoir 171 has an aperture to which a first end of a first pipe 180 is connected. The lower reservoir 173 has an aperture to which a first end of a second pipe 181 is connected. The balancing cylinder 170 is further configured to accept a pipe 190 having a first end and a second end. The first end resides in the lower reservoir 173 and allows fluid communication between an outside source and the lower reservoir 173.

The processing chamber 101 comprises an upper element 110 and a lower element 150. The upper element 110 comprises a plate 120 that divides an inner cavity of the upper element 110 into a seal-energizing cavity 115 and an upper process cavity 116. The upper element 110 is configured to accommodate the pipe 180 such that a second end of the pipe 180 is operatively coupled to the seal-energizing cavity 115. In this way, the seal-energizing cavity 115 is in communication with the upper reservoir 171. Moreover, as described below, preferably a volume defined by the seal-energizing cavity 115 and the upper reservoir 171 is isolated.

The upper element 110 is configured to accommodate the pipe 181 such that a second end of the pipe 181 is in communication with the upper process cavity 116. The plate 120 is slidably mounted within the inner cavity of the upper element 110 and contains a piston seal 125. Thus, as illustrated in FIG. 1, when the plate 120 is slid in the direction of the arrow 1, a volume of the seal-energizing cavity 115 is decreased and a volume of the upper process cavity 116 is increased. As depicted in FIG. 1, a cross-section of the plate 120 is in the shape of an inverted U. The end of the inverted –U is a sealing face 130 containing a sealing element 131, such as an o-ring, described in more detail below. The lower element 150 has an upper surface 156 coupled to a platen 155.

Figure 2:
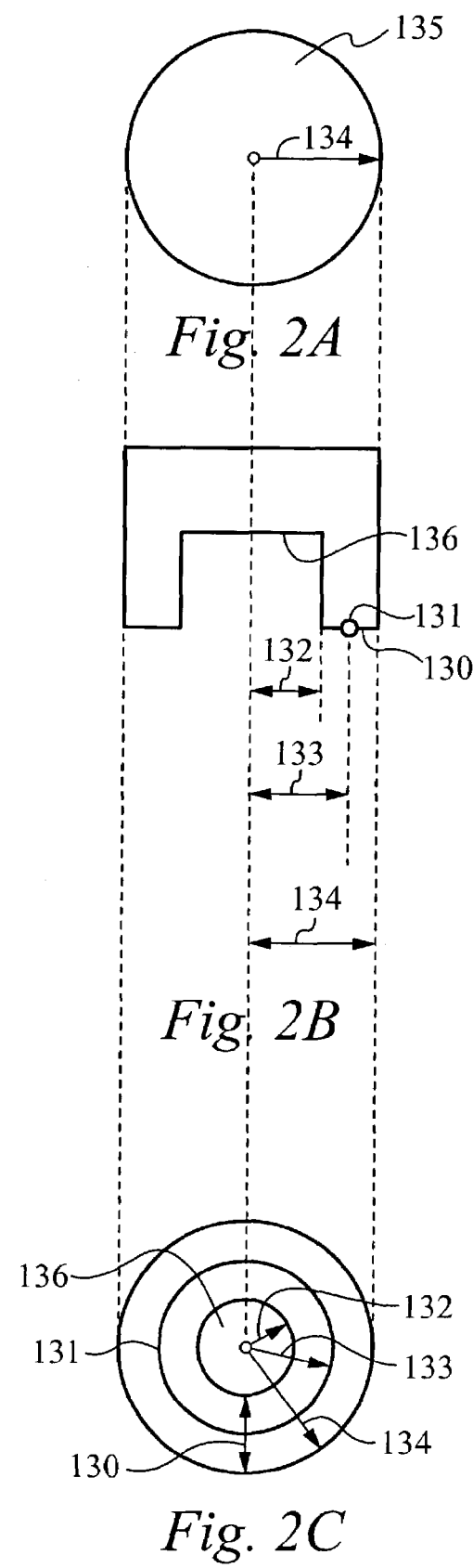
FIGS. 2A–C illustrate a top view, a side cross-sectional view, and a bottom view, respectively, of a plate used to form both a sealing-energizing cavity and a processing volume in accordance with the present invention.

FIGS. 2A–C illustrate a top view, a side cross-sectional side view, and a bottom view, respectively, of the plate 120. FIG. 2A illustrates the plate 120 as viewed from the seal-energizing cavity 115. FIG. 2A shows an outer face 135 of the plate 120, which forms a surface of the seal-energizing cavity 115. The outer face 135 has a radius 134 and a corresponding surface area. FIG. 2B illustrates a cross-sectional side view of the plate 120. FIG. 2B shows that a cross-section of the plate 120 has an inverted U-shape. FIG. 2B indicates, by the arrow 132, a radius of an inner face 136 of the plate 120. The inner face 136 defines a surface of the processing volume (140, FIG. 3) when the processing assembly 100 is in a closed position. FIG. 2B further shows the sealing face 130 and the sealing element 131 contained within a sealing groove on the sealing face 130, both described in more detail below. FIG. 2C illustrates a bottom view of the plate 120, as seen from the processing volume 140, FIG. 3. As illustrated in FIGS. 2A–C, the inner face 136 and the outer face 135 are opposing faces of the plate 120. Preferably, as depicted in FIGS. 2A–C, a surface area of the outer face 135 depicted by the radius 134 is larger than a surface area of the inner face 136 depicted by the arrow 132. In one embodiment, the inner face 136 and the outer face 135 are both substantially planar.

It will be appreciated that while FIGS. 2A–C depict the plate 120 as circular, the plate 120 can have other shapes, geometrical and non-geometrical. Furthermore, while FIGS. 2A–C depict the sealing element 131 and thus its associated sealing groove (not shown) as circular and located on the plate 120, it will be appreciated that the sealing element 131 and its associated groove can have other shapes, both geometrical and non-geometrical, and can be located on other components in the processing assembly 100. For example, the sealing element 131 and its associated groove can be located on the surface 156 of the lower component (150, FIG. 1), on the platen (155, FIG. 1), or at other locations.

Figure 3:
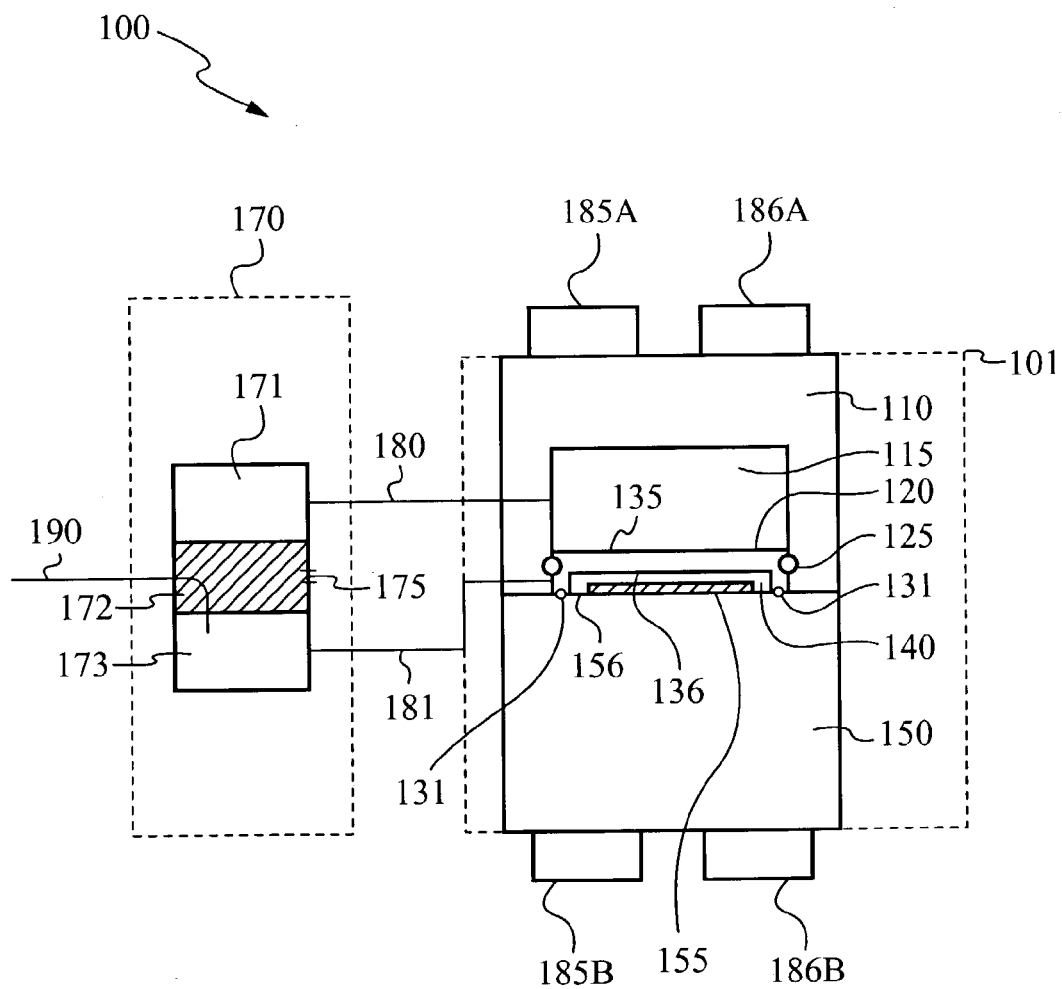
FIG. 3 illustrates the processing system of FIG. 1 in a closed position.

Referring to FIG. 3, in operation, a semiconductor wafer (not shown) that is to undergo processing is placed onto the platen 155 and, as described below, the upper element 110 and the lower element 150 are brought into contact to form a processing volume 140. The processing assembly 100 is now in the closed position. The processing volume 140 is defined by the inner face 136 of the plate 120, the sealing ring 131, and a portion of the upper surface 156. The platen 155 is contained within the processing volume 140. As described in detail below, the processing volume 140 is maintained by generating a pressure within the seal-energizing cavity 115, forcing the plate 120 and thus the sealing ring 131 against the surface 156 of the lower element 150, thus forming a processing volume seal. Processing materials are now introduced into the processing volume 140 to process the semiconductor wafer. It will be appreciated that in accordance with the present invention, the semiconductor wafer can be processed using any number and combination of processing methods, including, but not limited to, vacuum, low-pressure, atmospheric, high-pressure, and supercritical processing, used in cleaning, deposition, or other semiconductor fabrication steps.

Figure 4:
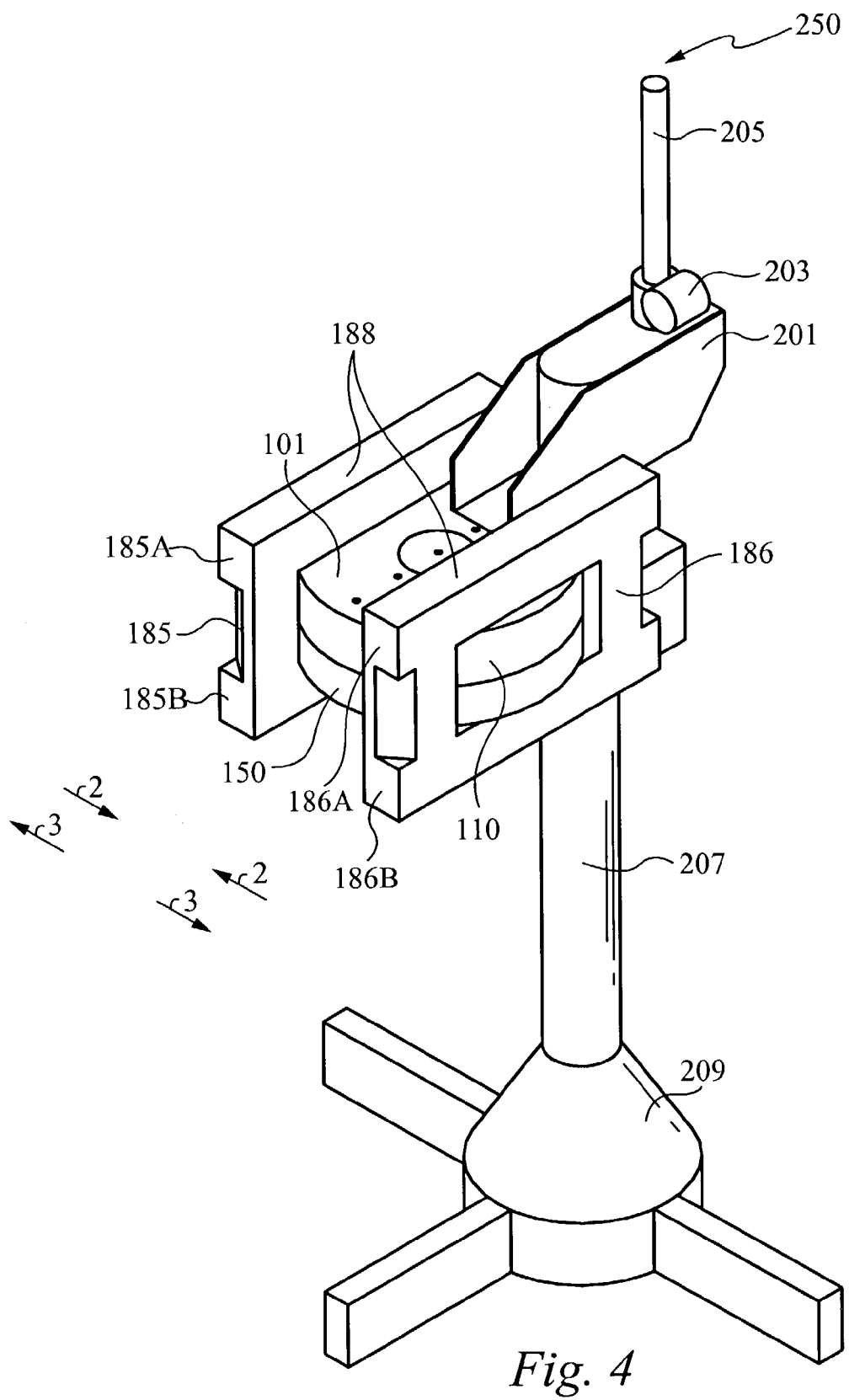
FIG. 4 illustrates the processing system of FIG. 1 in a closed position and a yoke and stand assembly.

FIG. 3 also shows a cross section 185A–B and 186A–B of a yoke 188 (FIG. 4) that acts as an additional clamp to tightly couple the upper element 110 to the lower element 150, helping to maintain the processing volume 140 during processing. FIG. 3 illustrates a left upper arm 185A and a left lower arm 185B of the yoke 188, which together secure one side of the processing chamber 101, and a right upper arm 186A and a right lower arm 186B of the yoke 188, which together secure another side of the processing chamber 101. The left upper arm 185A and the left lower arm 185B form part of a left arm 185 (FIG. 4). The right upper arm 186A and the right lower arm 186B form part of a right arm 186 (FIG. 4).

FIG. 4 illustrates the processing chamber 101, the yoke 188, and a stand assembly 250 used to support the processing assembly (100, FIG. 1). FIG. 4 illustrates the processing chamber 101 of FIG. 3 in the closed position. For simplification, FIGS. 4 and 5 do not show the balancing cylinder 170 or the pipes 180, 181, and 190. FIG. 4 illustrates how the yoke arms 185 and 186 collapse around the processing chamber 101 to tightly couple the upper element 110 to the lower element 150. The yoke 188 can have various structures known to those skilled in the art. For example, the yoke arms 185 and 186 can be wedge shaped so that as they are moved in the direction denoted by the arrows 2 in FIG. 4, the upper element 110 and the lower element 150 are pushed toward and secured against each other; and as the yoke arms 185 and 186 are moved in the direction denoted by the arrows 3, the upper element 110 and the lower element 150 are separated.

It will be appreciated that structures other than a yoke can be used to more securely clamp the upper element 110 to the lower element 150. For example, a T-bolt located on one of the upper element 110 and the lower element 150, and a nut, located on the other of the upper element 110 and the lower element 150, can be used to provide additional structure to tightly couple the upper element 110 to the lower element 150 during processing.

FIG. 4 also illustrates a stand assembly comprising a base 209, a bottom extension 207 coupled to the base 209 and upon which the yoke 188 is slidably mounted, thus allowing the height of the yoke 188 and the attached processing chamber 101 to be adjusted; a clamp 201 and weight 203, which together provide an extra force on the center of the processing chamber 101 to keep the upper element 110 secured against the lower element 150; and a top extension 205, which allows for the securing and removal of the clamp 201 and the weight 203.

Figure 5:
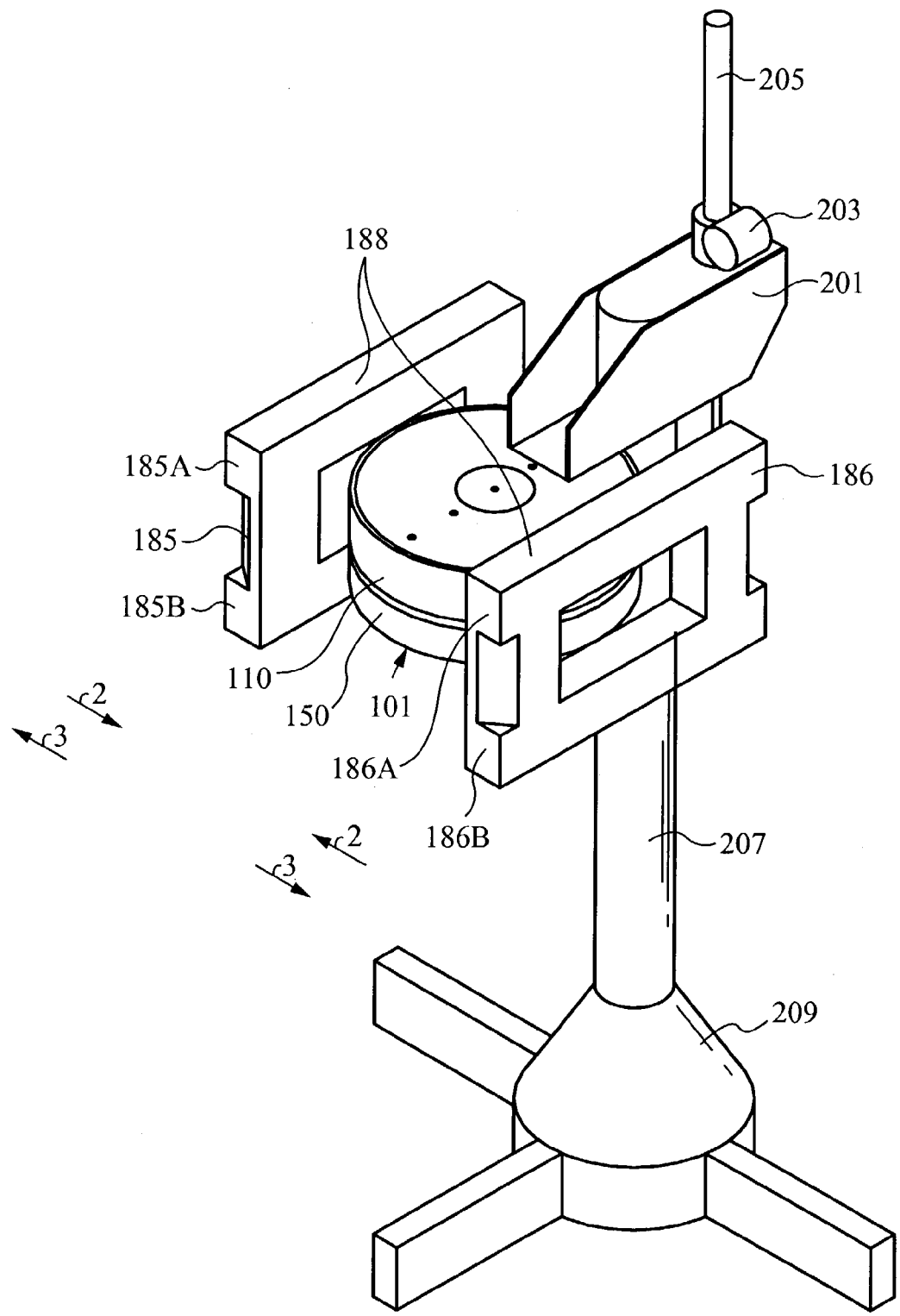
FIG. 5 illustrates the processing system in an open position and the yoke and stand assembly, all of FIG. 4.

FIG. 5 illustrates the processing chamber 101 of FIG. 4 in an open position, with the yoke 188 and the stand assembly 250. In FIG. 5, the weight 203 has been lifted from the clamp 201, the clamp 201 has been lifted from the yoke 188, and the yoke 188 has been removed from the processing chamber 101 by moving it in the direction denoted by the arrows 3. The upper element 110 has been displaced from the lower element 150 so that a semiconductor wafer can be inserted into or removed from the processing chamber 101.

FIG. 3 is again referred to, to explain the operation of one embodiment of the present invention. In operation, a semiconductor wafer (not shown) is placed onto the platen 155. The upper element 110 is brought into contact with the lower element 150, and the yoke arms 185A–B and 186A–B are positioned to tightly hold the upper element 101 to the lower element 150. Next, a sealing material such as an incompressible or nearly incompressible fluid, such as water, is introduced into the upper reservoir 171 of the balancing cylinder 170 and thus flows into the sealing cavity 115. It will be appreciated that other incompressible fluids, such oil, can be used as a sealing material. In addition, materials other than an incompressible or nearly incompressible fluid can be used in accordance with the present invention. It will also be appreciated that the incompressible or nearly incompressible fluid can be introduced at any time before processing, such as, for example, when the processing assembly 100 is in the open position.

Next, a processing material is introduced into the lower reservoir 173. The processing material can, for example, be a cleaning material used in dry cleaning, wet cleaning, supercritical cleaning, or any other cleaning method. Alternatively, the processing material can be any material used to process a semiconductor or a non-semiconductor device. In one embodiment of the present invention, the cleaning material is $CO_2$, which is later brought to a supercritical state and used to clean photoresist residue from the surface of a semiconductor wafer in the processing volume 140. $CO_2$ can, for example, be introduced into the lower reservoir 173, through the pipe 190, which is later capped. The $CO_2$ travels through the pipe 181, and then into the processing volume 140. The $CO_2$ can then be brought to a supercritical state once inside the processing volume 140 to form supercritical $CO_2$. The supercritical $CO_2$ can then by cycled through the processing volume 140 to clean a semiconductor wafer residing on the platen 155.

The operation of the supercritical chamber and the use of supercritical $CO_2$ are taught in U.S. patent application Ser. No. 09/912,844, titled "Supercritical Processing Chamber for Processing Semiconductor Wafer," and filed Jul. 24, 2001; U.S. patent application Ser. No. 10/121,791, titled "High Pressure Processing Chamber for Semiconductor Substrate Including Flow Enhancing Features," and filed Apr. 10, 2002; and U.S. patent application Ser. No. 09/704,641, titled "Method and Apparatus for Supercritical Processing of a Workpiece," and filed Nov. 1, 2000, all of which are hereby incorporated by reference in their entireties.

Figure 6:
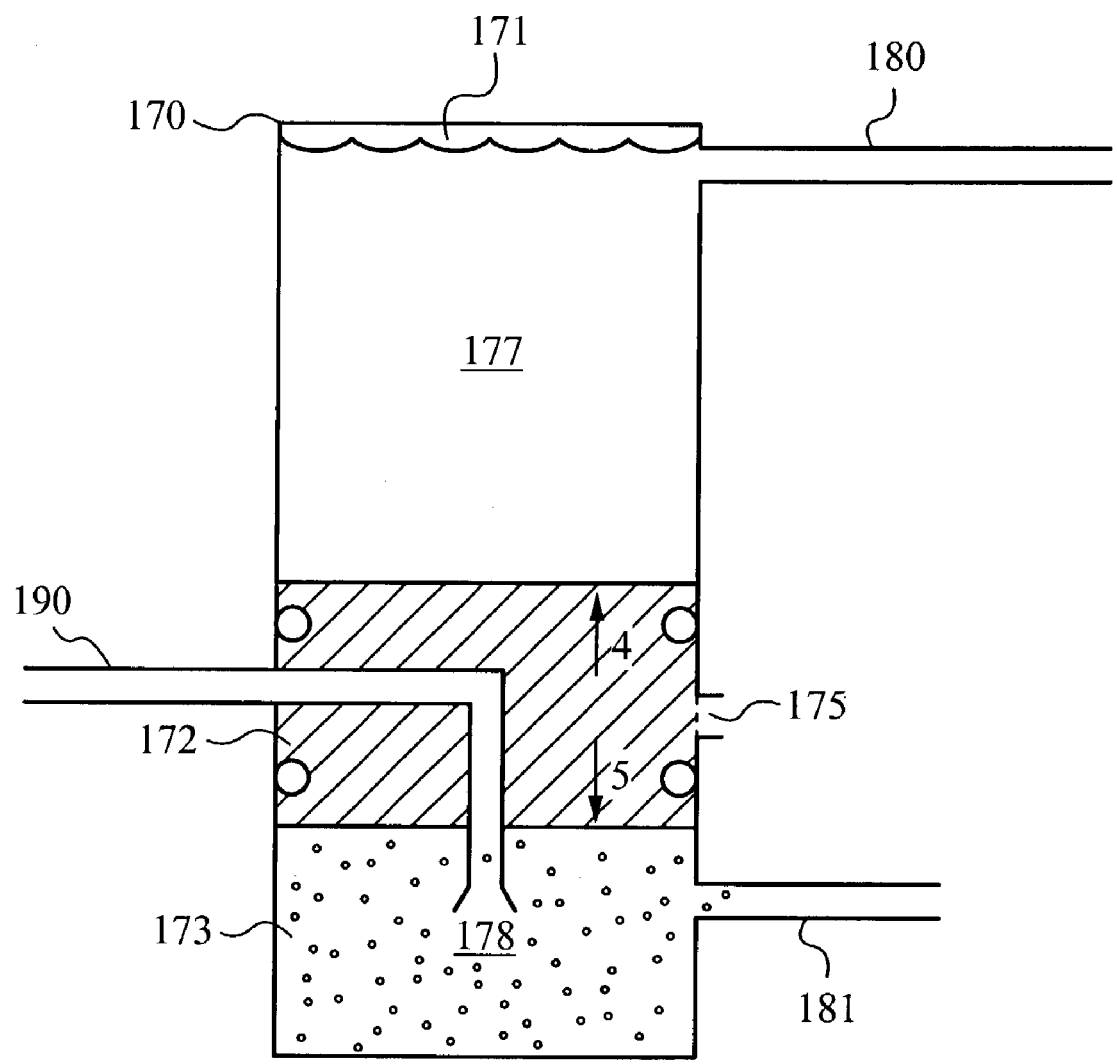
FIG. 6 illustrates a side cross-sectional view of a balancing cylinder in accordance with one embodiment of the present invention, during normal processing.

As discussed above, the present invention ensures that the processing volume (140, FIG. 3) is maintained during processing. FIG. 6 is a more detailed schematic of the balancing cylinder 170 of FIGS. 1 and 3, illustrating the balancing cylinder 170 when the processing volume (140, FIG. 3) is maintained, that is, during normal processing. As described in more detail below, with respect to FIGS. 6 and 7, the balancing cylinder 170 can be used to ensure that the processing volume 140 is maintained while a semiconductor device is being processed within the processing volume 140. As illustrated in FIG. 6, the upper reservoir 171 contains an incompressible fluid 177 such as water or oil. The incompressible fluid 177 flows through the pipe 180 and completely or partially fills the seal-energizing cavity (e.g., 115, FIG. 3). Preferably, a volume defined by the upper reservoir 171 and the seal-energizing cavity (115, FIG. 3) is isolated. Preferably, a cleaning fluid 178 that can be taken to a supercritical state is introduced into the pipe 190, where it completely or partially fills the lower reservoir 173 and is thus introduced into the processing volume 140 of the closed processing chamber 101. During processing, the cleaning fluid 178 is brought to a supercritical state so that a semiconductor wafer in the processing volume 140 is cleaned. It will be appreciated that the steps of introducing a fluid and bringing it to a supercritical or other processing state can occur any number of times in any number of processing cycles. During operation, the piston 172 is positioned so that it blocks the aperture 175.

The balancing cylinder 170 advantageously ensures that the processing volume 140 is tightly sealed. It achieves this by balancing the processing pressure within the processing volume 140 with the sealing pressure in the seal-energizing cavity 115. In one example, referring to FIGS. 3 and 6, the processing pressure is larger than the sealing pressure. Because the seal-energizing cavity 115 is in communication with the upper reservoir 171 through the pipe 180, the pressures within both are equal; and because the processing volume 140 is in communication with the lower reservoir 173 through the pipe 181, the pressures within both are equal. Hence, when the processing pressure is greater than the sealing pressure, the piston 172 is forced in the direction indicated by the arrow 4 (FIG. 6). Because the volume defined by the upper reservoir 171 and the seal-energizing cavity (115, FIG. 3) is isolated, this motion in the direction of the arrow 4 increases the sealing pressure and decreases the processing pressure. This continues until the processing pressure equals or balances the sealing pressure. Likewise, when the processing pressure is less than the sealing pressure, the piston 172 is forced in the direction indicated by the arrow 5 (FIG. 6), decreasing the sealing pressure and increasing the processing pressure. Again, this continues until the processing pressure equals or balances the sealing pressure because the fluid in the upper reservoir is incompressible or nearly incompressible. Thus, the processing pressure balances or tracks the sealing pressure and the sealing pressure does not have to be pre-loaded to the maximum possible processing pressure.

Figure 7:
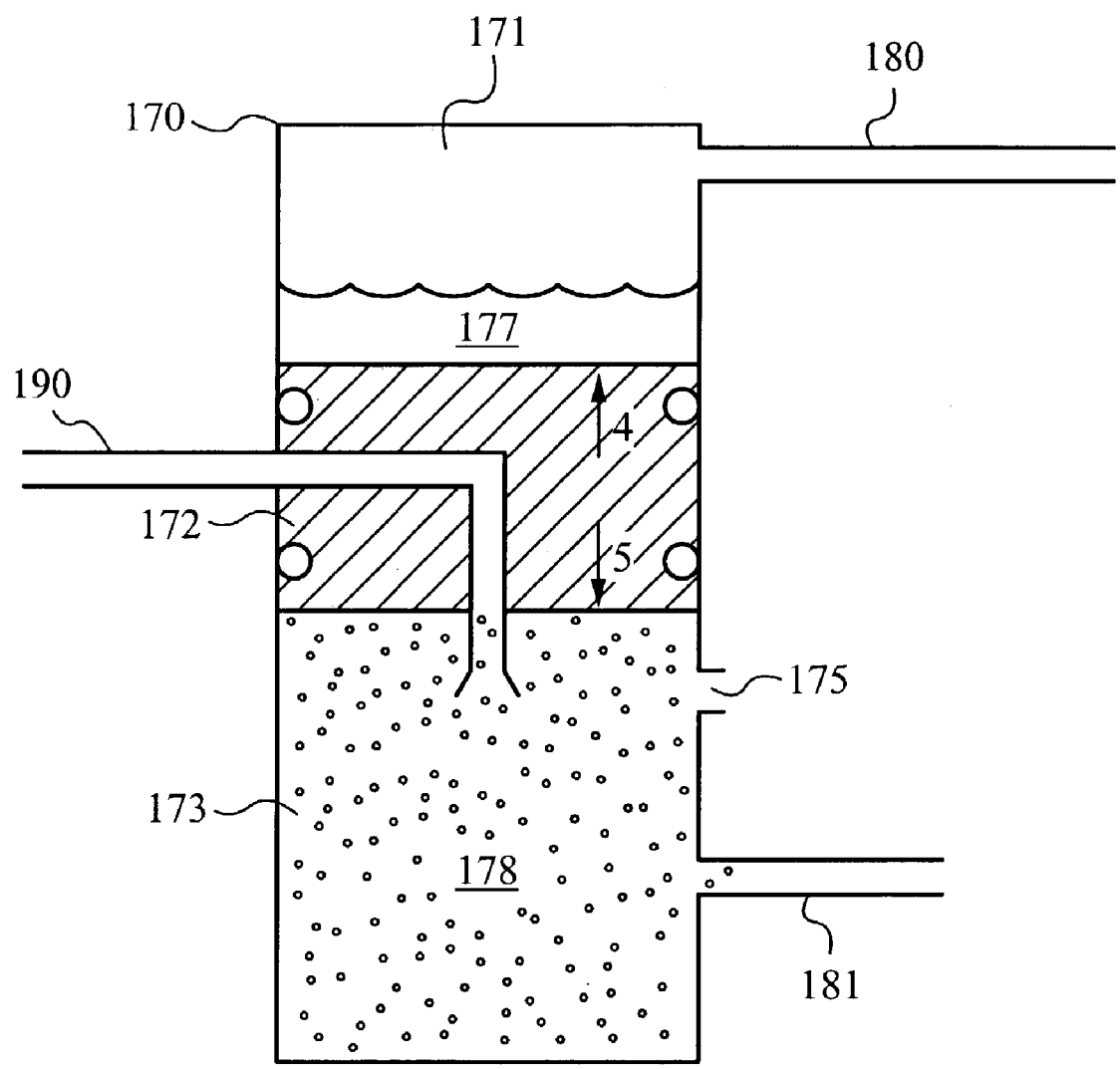
FIG. 7 illustrates the balancing cylinder of FIG. 6 during abnormal processing.

FIG. 7 is a more detailed schematic of the balancing cylinder 170 of FIG. 6, when an adequate pressure is not maintained in the seal-energizing cavity (115, FIG. 3), that is, during abnormal processing. This may occur for several reasons. For example, the seal-energizing cavity 115 may have a leak and therefore cannot retain the incompressible fluid 177 received from the upper reservoir 171. Or, the upper reservoir 171 and hence the seal-energizing cavity 115 may have inadvertently not been filled with the incompressible fluid 177. In any case, if the seal-energizing cavity 115 does not have sufficient pressure (that is, the sealing pressure falls below a threshold pressure), the semiconductor cleaning process can be compromised. Because the processing volume 140 is not maintained, the processing material 178 will leak from the processing volume (140, FIG. 3) during processing, and external particles may enter the processing chamber, contaminating the semiconductor wafer. Embodiments of the present invention ensure that this does not occur.

As illustrated in FIG. 7, when the sealing pressure falls below a threshold value, the piston 172 is moved in the direction indicated by the arrow 4. The piston vent hole 175 is now located in the lower reservoir 173, and the processing material 178 is vented through the vent hole 175 and safely routed to a vessel (not shown), to the air, or to some other container in which it can be stored. Thus, the processing material 178 does not enter the processing volume 140, and the semiconductor processing is not compromised. Moreover, the venting process can transmit a signal used to stop or suspend device processing.

Figure 8:
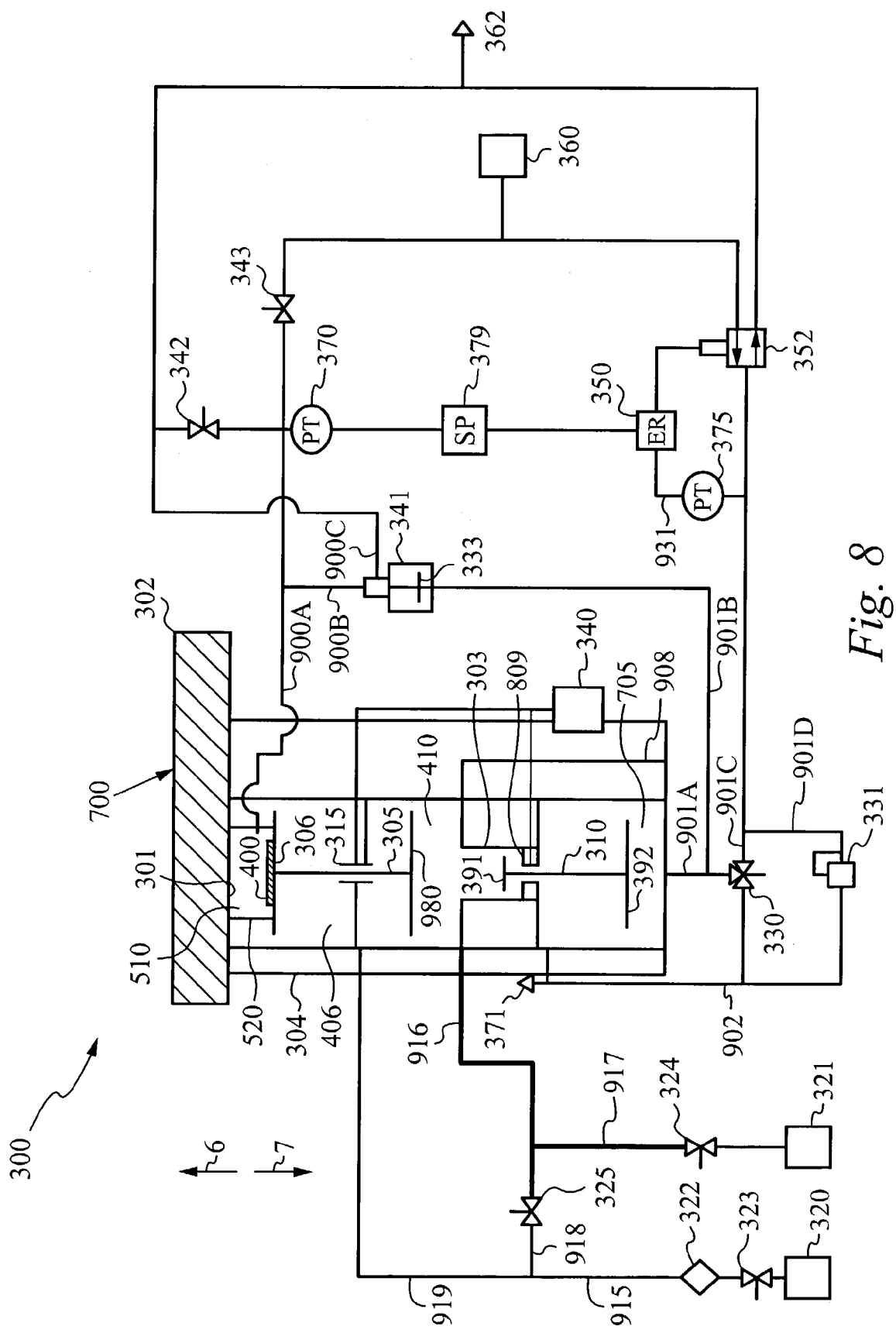
FIG. 8 illustrates a side cross-sectional view and schematic diagram of a processing chamber and associated valve assembly in accordance with one embodiment of the present invention.
Figure 9:
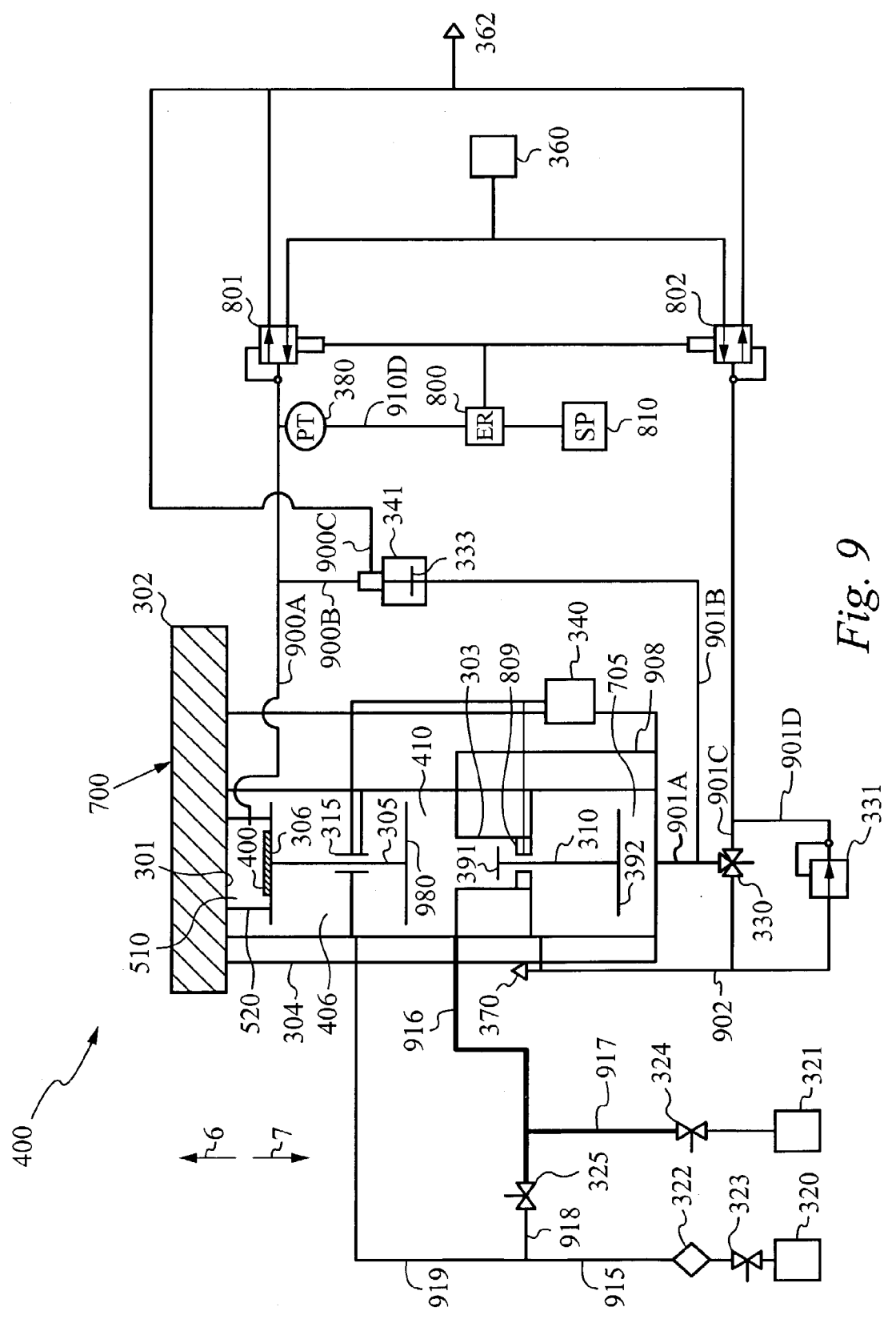
Figure 10:
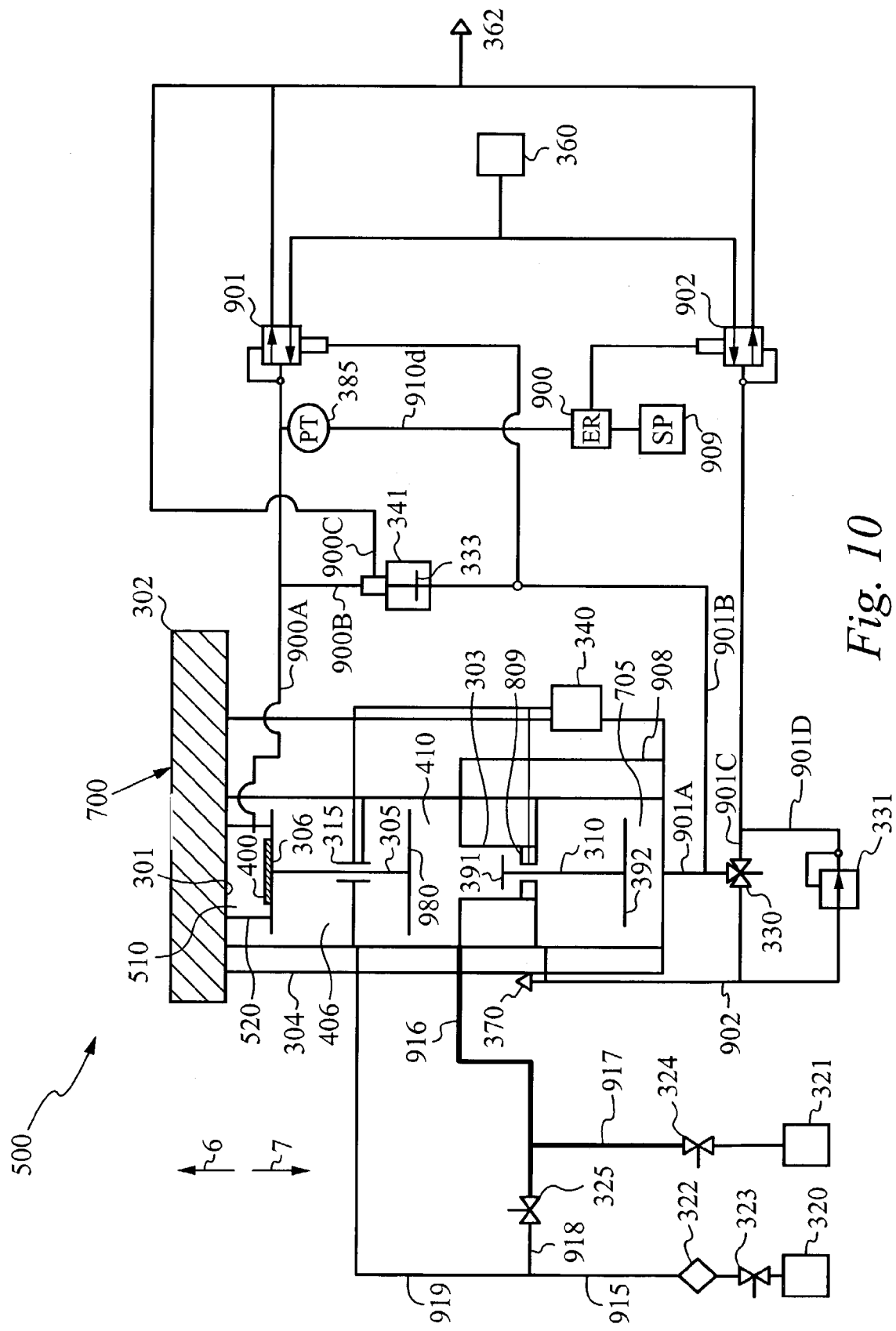
FIG. 10 illustrates a side cross-sectional view and schematic diagram of a processing chamber and associated valve assembly in accordance with another embodiment of the present invention.

FIGS. 8–10 illustrate embodiments comprising a pressure intensifier, which receives a low pressure in a low-pressure chamber and intensifies it to produce a larger sealing pressure. Accordingly, the embodiments in FIGS. 8–10 require that a relatively small pressure be generated and maintained to produce the sealing pressure. These embodiments thus require less energy and space to maintain a processing volume and accordingly are more efficient.

By using a pressure intensifier to pressurize an incompressible fluid such as water, for example, to the necessary sealing pressure, the need for high-pressure hydraulic equipment is eliminated. The pressure in the pressure intensifier is selected to be low enough so that the supercritical process fluid will expand to the gas phase as it enters the pressure intensifier. As the supercritical process fluid expands to the gas phase, its density decreases and the mass of the process fluid required by the pressure intensifier to pressurize the incompressible fluid to the required sealing pressure is less than if the intensification were not used. Such as structure advantageously decreases the cost of the process fluid that must be input into a processing system to maintain a processing volume seal and thus increases the efficiency of the processing system.

FIG. 8 is a side cross-sectional view and schematic diagram of a processing assembly 300 comprising a processing chamber and associated valve assembly in accordance with one embodiment of the present invention. The processing assembly 300 comprises a processing chamber 700; a $CO_2$ supply vessel 360; a seal-leak detector 340; a water vessel 320; a drainage port 321; air-operated valves 323, 324, 325, 330, 342, and 343; a water filter 322; a pressure-ratio safety valve 341; an electronic controller 350; pressure transducers 370 and 375; a set-point signal source 379; vents 362 and 371; a pressure regulator 352; and a pressure relief valve 331. In one embodiment, the electronic regulator 350 is an electronic pressure controller such as the ER3000, manufactured by Tescom Corporation, Elk River, Minn.

The processing chamber 700 comprises an upper element 302 and a lower element 304. The upper element 302 has an inner surface 301. The lower element 304 comprises an upper volume 406, a seal-energizing cavity 410, and a pressure intensifier 908. The lower element 304 contains a pedestal 305. The pedestal 305 comprises a platen 306 contained in the upper volume 406 and a base 980 contained in the seal-energizing cavity 410. The platen 306 has a stem slidably mounted in a neck 315, allowing the pedestal 305 to slide upward, in the direction of the arrow 6, and downward, in the direction of the arrow 7. The platen 306 contains a sealing element 520. Preferably the sealing element 520 comprises a gasket such as an o-ring. The height of the sealing element 520 with respect to the other components is exaggerated for ease of illustration. FIG. 8 further illustrates a semiconductor wafer 400 resting on the platen 306.

As illustrated in FIG. 8, the water vessel 320 is coupled to the air-operated valve 323, which is coupled to the water filter 322. The water filter 322 is coupled to the air-operated valve 325, which is coupled to the seal-energizing cavity 410. The drainage port 321 is coupled to the air-operated valve 325, which is coupled to the seal-energizing cavity 410. The leak detector 340 is coupled to the neck 315 and a piston seal 809. The pressure ratio safety valve 341 is coupled to the processing volume 510, the vent 362, the air-operated valve 343, and the pressure intensifier 908. The pressure relief valve 331 is coupled to the vent 370, the air-operated valve 330, the pressure transducer 375, and the pressure regulator 352. The air-operated valve 330 is coupled to the pressure intensifier 908, the vent 370, the pressure-relief valve 331, the pressure transducer 375, and the pressure regulator 352. The electronic regulator 350 is coupled to the set-point signal source 379, the pressure transducer 375, and the pressure regulator 352. The $CO_2$ supply vessel 360 is coupled to the pressure regulator 352 and, through the air-operated valve 343, to the processing volume 510. The pressure transducer 371 is coupled by the air-operated valve 342 to both the vent 362 and the pressure ratio safety valve 341.

The pressure intensifier 908 comprises a low-pressure chamber 705; a neck 303 having a cross-sectional area smaller than a cross-sectional area of the low-pressure chamber 705; a piston 310 having a base 392 contained within the low-pressure chamber 705 and a head 391 contained within the neck 303; and a piston seal 809. The neck 303 is in communication with the seal-energizing cavity 410, such that when the head 391 is moved upward, in the direction of the arrow 6, a pressure within the seal-energizing cavity 410 is increased. Preferably, the base 392 has a cross-sectional area larger than a cross-sectional area of the head 391.

FIG. 8 illustrates the processing chamber 700 in a closed position. A processing volume 510 is defined by the inner surface 301, the sealing element 520, and an inner surface of the platen 306. As illustrated in FIG. 8, the sealing element 520 is preferably positioned within the platen 306 so that a cross-sectional area of the processing volume 510 is less than a cross-sectional area of the platen 306. A processing volume seal is thus formed by the inner surface 301 and the sealing element 520.

When the base 980 is moved upward, the sealing element 520 is forced against the surface 301, placing the processing assembly 300 in the closed position. In the closed position, the processing volume 510 is formed. When the base 980 is moved downward, the sealing element 520 is displaced from the surface 301, placing the processing assembly 300 in an open position. In the open position, the processing volume 510 is broken so that a semiconductor wafer 400 can be inserted onto and removed from the platen 306.

As described in more detail below, when the processing assembly 300 is in the open position, a semiconductor wafer is placed on the platen 306. A sealing material is then introduced into the seal-energizing cavity 410 to move the pedestal 305 and thus the platen 306 in the direction of the arrow 6. The processing assembly 300 is now in the closed position. The pressure intensifier 908 can then be used to ensure that, while the semiconductor wafer is being processed in the processing volume 510, a processing volume seal (and thus the processing volume 510) is maintained. When processing is complete, the sealing material can be removed from the seal-energizing cavity 410 to move the processing assembly 300 to the open position. The semiconductor wafer can then be removed from the platen 306. It will be appreciated that devices other than semiconductor wafers can be processed in accordance with the present invention.

In operation, the processing assembly 300 is placed in the closed position by introducing low-pressure water from the water vessel 320 into the seal-energizing cavity 410. The low-pressure water travels from the water vessel 320, through the air-operated valve 323, the water filter 322, the piping 915 and 918, the air-operated valve 325, the piping 916, and into the seal-energizing cavity 410. The low-pressure water enters the seal-energizing cavity 410 between the head 391 and the base 980. As the low-pressure water flows into the seal-energizing cavity 410, the water displaces the base 980 upward and displaces the head 391 downward. Displacing the base 980 upward causes the sealing element 520 to press against the upper surface 301, thereby forming the processing volume 510. The processing assembly 300 is now in the closed position. When position sensors (not shown) detect that the platen 306 has moved upward to form the processing volume 510 and that the head 391 has moved downward to its limit (e.g., against the piston seal 809), the air-operated valves 323 and 325 close to isolate the seal-energizing cavity 410, now filled with low-pressure water.

Using a low-pressure material such as low-pressure water advantageously requires a relatively small amount of energy to quickly fill the seal-energizing cavity 410. In other words, because the water flows into the seal-energizing cavity 410 at low pressure, the components that supply water are not required to transfer and hold high-pressure water. The processing assembly 300 thus operates more efficiently than would a processing assembly that uses high-pressure equipment to fill the seal-energizing cavity 410 and thus form the processing volume 510.

Once the processing assembly 300 is in the closed position, low-pressure $CO_2$ gas is introduced from the $CO_2$ supply vessel 360 into the low-pressure chamber 705. The $CO_2$ gas travels from the $CO_2$ supply vessel 360, through the pressure regulator 352, through the piping 901C, the air-operated valve 330, the piping 901A, and into the low-pressure chamber 705. The introduction of the $CO_2$ gas into the low-pressure chamber 705 exerts a force on the piston 310 which pushes the base 392 and thus the head 391 upward, in the direction of the arrow 6. Since the low-pressure water above the head 391 is isolated, it cannot flow out of the seal-energizing cavity 410. The low-pressure water becomes pressurized and pushes the head 391 and thus the platen 306 upward, forcing the sealing element 520 against the surface 301 to maintain the processing volume 510.

Next, during a device processing step, $CO_2$ is introduced into the processing volume 510, thus increasing the processing pressure. The $CO_2$ travels from the supply vessel 360, through the air-operated valve 343 over the piping 900A, and into the processing volume 510. The set point signal source 379 is set to a process pressure set point, which equals the desired processing pressure. The pressure transducer 370 monitors the processing pressure. When the pressure transducer 370 detects that the processing pressure equals the process pressure set point, it generates a signal transmitted to the air-operated valve 343 to stop the flow of $CO_2$ into the processing volume 510.

The processing pressure is now set to the desired operating pressure and the semiconductor wafer can now be processed. The processing force generated by the processing pressure is counterbalanced by the sealing force as now described.

The pressure transducer 370 monitors the processing pressure and transmits a related processing signal to the electronic controller 350. The pressure transducer 375 monitors an intensifier pressure generated within the low-pressure chamber 705 and transmits a related sealing signal to the electronic controller 350. If the processing signal and the sealing signal indicate that the processing pressure is greater than the sealing pressure, the electronic controller 350 sends a signal to the pressure regulator 352. The pressure regulator 352 now routes $CO_2$ from the $CO_2$ supply vessel 360 to the low-pressure chamber 705, thus increasing the intensifier, and thus the sealing, pressure.

The electronic controller 350 also ensures that the sealing force counterbalances the processing force when the processing pressure set point is changed. For example, if a lower processing pressure is desired, the processing pressure set point can be decreased. The air-operated valve 342 can be opened to decrease the processing pressure. The pressure transducer 370 detects this fall in processing pressure and sends a processing signal to the electronic controller 350. The electronic controller 350 then activates the pressure regulator 352 to vent the low-pressure chamber 705 through the vent 362, thus decreasing the intensifier pressure. Venting continues until the sealing force equals the processing force.

When processing within the processing volume 510 is complete, the processing assembly 300 is placed in the open position. This is accomplished by draining the low-pressure water in the seal-energizing cavity 410 through the piping 916 and 917, the air-operated valve 324, and out the drainage port 321. It will be appreciated that operation of the air-operated valves 323, 324, and 325 must be coordinated so that (a) low-pressure water is transferred from the water supply vessel 320 and into the seal-energizing cavity 410 to place the processing assembly 300 in the open position, and (b) low-pressure water is transferred from the seal-energizing cavity 410 and out through the drainage port 321 to place the processing assembly 300 in the closed position.

During processing, $CO_2$ can be circulated within the processing volume 510 to clean the surface of the semiconductor wafer 400. Later, the air-operated valve 343 can be opened so that the $CO_2$ used within the processing volume 510 can be returned to the $CO_2$ supply vessel 360 and used in a subsequent processing step. It will be appreciated that $CO_2$ can be cycled through the processing volume 510 alone or in combination with other processing materials in one or more process cycles.

The pressure ratio safety valve 341 functions similarly to the balancing cylinder 170 of FIGS. 1 and 6. The pressure ratio safety valve 341 contains a piston 333. The piston 333 moves to further balance the processing pressure and the intensifier such that the intensifier pressure, when multiplied by the pressure intensifier 908 produces a pressure that generates a sealing force that equals or approximately equals the processing force, thus maintaining the processing volume 510. If the pressure within the low-pressure chamber 705 falls below this value (the low-pressure point), the processing volume 510 is vented through the piping 900A, 900B, and 900C, and out through the vent 362. The pressure ratio safety valve 341 thus complements the valve assembly to counterbalance the processing force with the sealing force, thus maintaining the processing volume 510.

Now the safety mechanisms of the processing assembly 300 are discussed. The pressure relief valve 331 ensures that the intensifier pressure never exceeds a threshold pressure. If the intensifier pressure exceeds the threshold pressure, the pressure relief valve 331 opens to vent the low-pressure chamber 705 through the piping 901A, 901C, 901D, and 902, and out the vent 370. The seal-leak detector 340 monitors the piston seal 809 and the neck 315. If a leak in either occurs, the seal-leak detector 340 can take preventive actions such as, for example, energizing a flashing light to warn an operator, disabling the processing assembly 300 so that processing is interrupted, or taking other action.

FIG. 9 illustrates a side cross-sectional view and schematic diagram of a processing assembly 400 in accordance with another embodiment of the present invention. The processing assembly 400 differs from the processing assembly 300 in FIG. 8 in that the processing assembly 400 uses an electronic pressure controller 800 to control the pressure regulators 801 and 802. Compared to FIG. 8, like-numbered elements perform similar functions. The processing assembly 400 comprises a pressure transducer 380, the electronic pressure controller 800, the pressure regulators 801 and 802, and a set-point signal source 810. The pressure transducer 380 is coupled to the processing volume 510, the electronic pressure controller 800, and the pressure regulator 801. The electronic pressure controller 800 is coupled to a set-point source 810 and the pressure regulators 801 and 802.

The electronic pressure controller 800 controls both the processing pressure and the intensifier pressure. The electronic pressure controller 800 uses a set point determined by the set point signal source 810 to control the pressure regulators 801 and 802. The pressure regulator 801 controls the processing pressure, and the pressure regulator 802 controls the intensifier pressure. The processing assembly 400 will vent both the processing volume 510 and the low-pressure chamber 705 if the pressure in the processing volume 510 exceeds a process set point. The electronic pressure controller 800 enables more continuous and precise control of the processing pressure than is possible with the structure illustrated in FIG. 8.

FIG. 10 illustrates a side cross-sectional view and schematic diagram of a processing assembly 500 in accordance with another embodiment of the present invention. The processing assembly 500 differs from the processing assembly 300 of FIG. 8 in that the processing assembly 500 uses an electronic pressure controller 900 to control a pressure regulator 902, which controls the intensifier pressure. Compared to FIG. 8, like-numbered elements perform similar functions. The processing assembly 500 comprises a pressure transducer 385, the electronic pressure controller 900, pressure regulators 901 and 902, and a set-point signal source 909. The pressure transducer 385 is coupled to the processing volume 510, the pressure regulator 901, and the electronic pressure controller 900. The electronic pressure controller 900 is also coupled to the set-point signal source 909 and the pressure regulator 902. The pressure regulator 901 is coupled to the $CO_2$ supply vessel 360, the processing volume 510, the vent 362, the pressure-ratio safety valve 341, the low-pressure chamber 705, and the air-operated valve 330. The pressure regulator 902 is coupled to the $CO_2$ supply vessel 360, the air-operated valve 330, and the pressure-relief valve 331.

The electronic pressure controller 900 uses an external set point from the set-point signal source 909. The electronic pressure controller 900 sends a signal to the pressure regulator 902, which controls the intensifier pressure. As the intensifier pressure rises to generate a force to counterbalance the force generated by the processing pressure, a pressure signal from the pressure intensifier 908 is transmitted to the pressure regulator 901, causing the processing pressure to track the sealing pressure. The processing pressure is monitored by a pressure transducer 385 coupled to the electronic pressure controller 900.

In yet another variation (not illustrated), a pressure regulator with an electronic pressure controller that responds to an external set point monitors the processing pressure and modulates a pressure regulator that controls the sealing pressure. The modulation ensures that the sealing pressure tracks the processing pressure.

Figure 11:
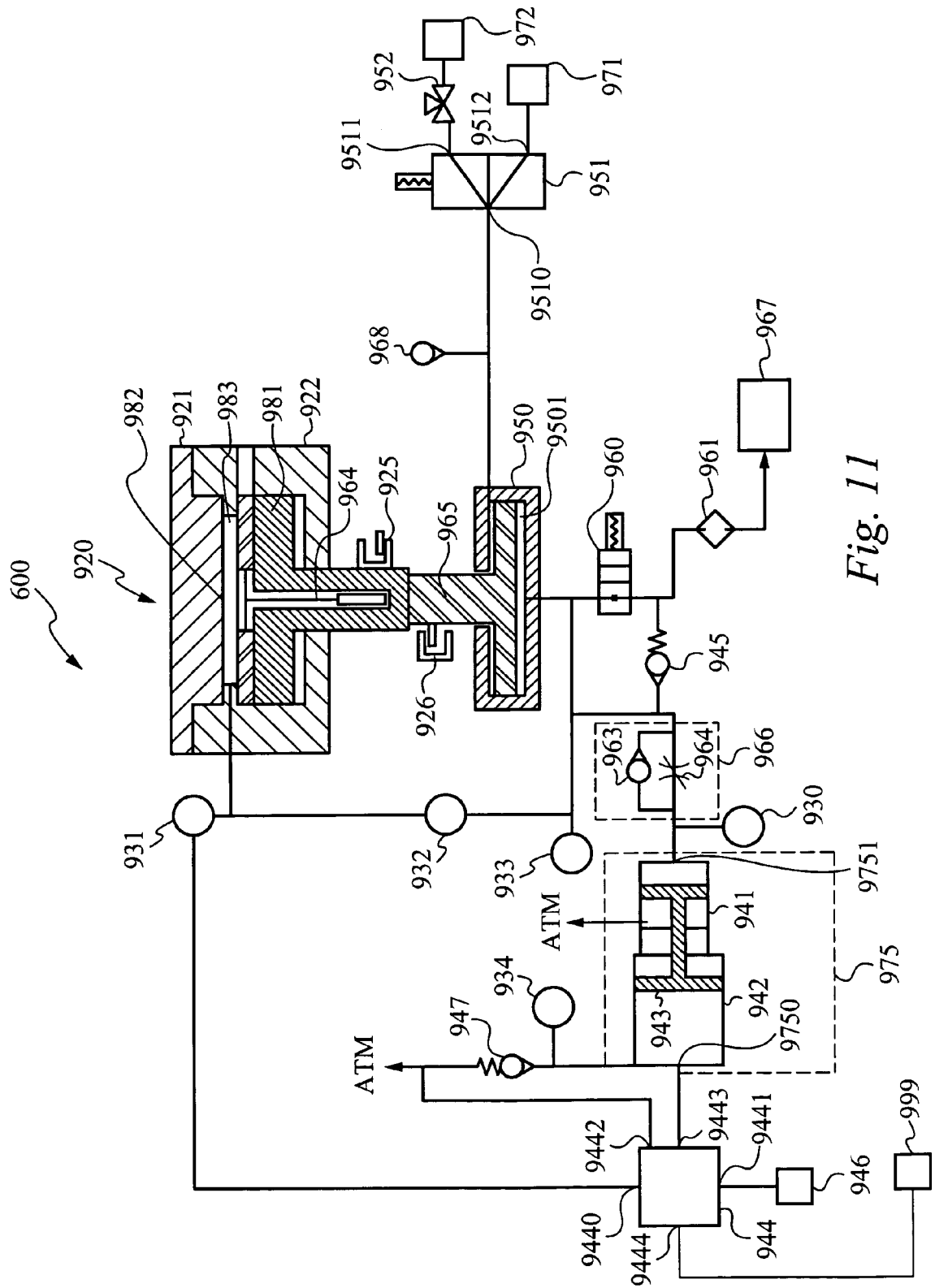
FIG. 11 illustrates a side cross-sectional view and schematic diagram of a processing chamber and associated valve assembly in accordance with another embodiment of the present invention.

FIG. 11 illustrates a side cross-sectional view and schematic diagram of a processing system 600, in accordance with another embodiment of the present invention. The processing system 600 comprises a processing chamber 920 having a top plate 921 and a bottom plate 922; a pins-position sensor 925; a platen 982 containing a plurality of pins (not shown); a pedestal-position sensor 926; a pedestal 981; a differential pressure switch 932; a pressure switch 933; a seal energizer 950; a pressure intensifier 975; a pressure regulator unit 944 having inputs 9440, 9441, and 9444 and outputs 9442 and 9443; an air-operated valve 952; pressure transducers 930, 931, and 934; pressure relief valves 945, 947, and 968; a filter 961; a solenoid control valve 960; a solenoid control valve 951 having an output 9510 and inputs 9511 and 9512; a directional flow controller 966; a vent 971; a hydraulic fluid vessel 967; compressed air supplies 972 and 999; and an external set point 946. The top plate 921 and the bottom plate 922 define a processing volume 983 containing the platen 982. The platen 982 supports a workpiece such as a semiconductor wafer (not shown) undergoing processing within the processing volume 983.

The directional flow controller 966 comprises a check valve 963 and a needle valve 964. The pressure intensifier 975 comprises a low-pressure chamber 942, a high-pressure chamber 941, and a piston 943 coupling the low-pressure chamber 942 to the high-pressure chamber 941. The pressure intensifier 975 has an input 9750 coupled to the low-pressure chamber 942, and an output 9751 coupled to the high-pressure chamber 941. Similar to the pressure intensifier 908 of FIG. 8, a low-pressure generated at the input 9750 is translated into a high-pressure generated at the output 9751. In one embodiment, the pressure regulator unit 944 comprises a MAC PPC93A, sold by TSI Solutions, 2220 Centre Park Court, Stone Mountain, Ga. 30087. In one embodiment, the filter 961 is a three-micron filter.

The output 9751 of the pressure intensifier 975 is coupled to the directional flow controller 966, and is thus coupled to an input of the check valve 963 and an input of the needle valve 964. An output of the directional flow controller 966, and thus an output of the check valve 963 and an output of the needle valve 964, is coupled to the pressure relief valve 945. The pressure relief valve 945 is coupled to the filter 961 and the solenoid control valve 960. An output of the solenoid control valve 960 is coupled to the filter 961. The filter 961 is coupled to the hydraulic fluid vessel 967, used to supply low pressure hydraulic oil. An output of the solenoid control valve 960 is coupled to the differential pressure switch 932 and to the seal energizer 950. An inner cavity 9501 (the seal-energizing cavity) of the seal energizer 950 is coupled by piping to an output 9510 of the solenoid control valve 951. Also coupled to the piping is the pressure relief valve 968. A first output 9511 of the solenoid valve 951 is coupled to an output of the air-operated valve 952. An input of the air-operated valve 952 is coupled to the compressed air supply 972. A second output 9512 of the solenoid valve 951 is coupled to the vent 971.

As illustrated in FIG. 11, the processing volume 983 is coupled to the pressure transducer 931 and the differential pressure switch 932. A first input 9440 of the pressure regulator unit 944 is coupled to the pressure transducer 931, a second input 9441 of the pressure regulator unit 944 is coupled to an external set point 946, and a third input 9444 of the pressure regulator unit 944 is coupled to the compressed air supply 999. A first output 9442 of the pressure regulator unit 944 is coupled to the pressure relief valve 947 and to the atmosphere through a vent (not shown). A second output 9443 of the pressure regulator unit 944 is coupled to the input 9750 of the pressure intensifier 975. The pressure relief valve 947 is coupled to the input 9750 of the pressure intensifier 975 by piping, to which is also coupled the pressure transducer 934. The pressure transducer can thus be used to monitor the pressure between the air-operated valve 947 and the input 9750 of the pressure intensifier 975.

In operation, a workpiece (not shown) is placed on pins (now shown) extending from the surface of the platen 982. The workpiece can be placed on the surface of the platen 982 by retracting the pins, and later, removed from the surface by extending the pins. The relation of the pins to the platen surface are monitored by the pins-position sensor 925. The use of pins are taught, for example, in U.S. patent application Ser. No. 10/289,830, titled "High Pressure Compatible Vacuum Chuck for Semiconductor Wafer Including Lifting Mechanism," filed Nov. 6, 2002, which is hereby incorporated by reference in its entirety.

Next, low-pressure oil is transmitted from the hydraulic fluid vessel 967, through the input of the air-operated valve 960, and into the seal-energizing cavity 9501 to close the processing chamber 920, as described above in relation to the processing assembly 300 of FIG. 8. Next, a processing material, such as supercritical $CO_2$, is introduced into the processing volume 983 to process the workpiece. The pressure within the processing volume 983 (the processing pressure) is translated into an electrical signal by the pressure transducer 931. The electrical signal is transmitted to the pressure regulator unit 944, which generates a mechanical output signal, such as a corresponding pressure. In normal operation, the mechanical output signal is transmitted to the input 9750 of the pressure intensifier 975. The pressure intensifier 975 then generates a high pressure output on its output 9751. The high pressure output is transmitted through the directional flow controller 966 and to the seal-energizing cavity 9501 to seal the processing chamber 920, as described above in relation to the processing assembly 300 of FIG. 8.

During abnormal operation, the pressure relief valve 945 can be used to operatively couple the output of the regulator unit 966 to the filter 961 and thus to the hydraulic fluid vessel 967. Alternatively, during abnormal processing, the solenoid control valve 960 can be used to operatively couple the output of the regulator unit 966 to the hydraulic fluid vessel 967.

The pressure relief valve 947 functions as a fail-safe mechanism on the low-pressure side of the pressure intensifier 975, venting the input 9750 of the pressure intensifier 975 when the pressure on the input 9750 reaches a preset value. The pressure relief valve 945 performs a similar function on the high-pressure side of the pressure intensifier 975, venting the output 9751 of the pressure intensifier 975 when the pressure on the output 9751 reaches a preset value.

As a workpiece undergoes processing within the processing volume 983 the processing pressure is translated by the pressure transducer 931 into an electrical signal transmitted to the pressure regulator unit 944. The pressure regulator unit 944 in turn, generates a low pressure, which is transmitted to the input 9750 of the pressure intensifier 975. The low pressure is approximately that pressure which, when transmitted to the input 9750 of the pressure intensifier 975 is translated to a high-pressure generated on the output 9751, generating a sealing force approximately equal to the processing force. In operation, the pressure regulator unit 944 compares the external set point 946 with an electrical (feedback) signal from the pressure transducer 931. If the external set point 946 is smaller than the feedback signal, then the pressure regulator unit 944 vents the pressure intensifier 975 to the atmosphere through the pressure relief valve 947. If the external set point 946 is larger than the feedback signal, then the pressure regulator unit 944 routes compressed air from the compressed air supply 999, to the input 9444 of the pressure regulator unit 944, through the output 9443, and into the input 9750 of the pressure intensifier 975. In this way, the sealing force is regulated to track the processing force.

It will be appreciated that the pressure relief valves 945, 947, and 968 ensure that the pressure transmitted between components never exceeds predetermined values. It will also be appreciated that the pressure transducers 930 and 934 can be used to display and thus monitor the pressure along piping used in the processing system 600.

It will be readily apparent to one skilled in the art that other various modifications may be made to the embodiments without departing from the spirit and scope of the invention as defined by the appended claims.

I claim:

1. An apparatus for processing a semiconductor wafer, comprising:
    a. an upper element;
    b. a lower element, wherein the upper element and the lower element are brought together to form a processing volume; and
    c. a means for sealing, wherein the means for sealing couples the upper element to the lower element to maintain the processing volume by generating a sealing force in a seal-energizing cavity to counterbalance a processing force generated within the processing volume,
        wherein one of the upper element and the lower element comprises a plate having an inner face and an opposing outer face, the plate slidably mounted in the one of the upper chamber and the lower chamber, the inner face defining the seal-energizing cavity and the outer face defining the processing volume.

2. The apparatus of claim 1, wherein a cross-sectional area of the inner face is larger than a cross-sectional area of the outer face.

3. The apparatus of claim 1, wherein both the inner face and the outer face are substantially planar.

4. The apparatus of claim 1, wherein the upper element and the lower element form a supercritical processing chamber.

5. The apparatus of claim 4, wherein the supercritical processing chamber comprises means for bringing a processing material to supercritical conditions.

6. An apparatus for processing a semiconductor wafer, comprising:
   a. an upper element;
   b. a lower element, wherein the upper element and the lower element are brought together to form a processing volume; and
   c. a means for sealing, wherein the means for sealing couples the upper element to the lower element to maintain the processing volume by generating a sealing force in a seal-energizing cavity to counterbalance a processing force generated within the processing volume, wherein the means for sealing comprises a balancing cylinder containing a piston, the piston dividing a volume of the balancing cylinder into a first reservoir and a second reservoir, the first reservoir in communication with the processing volume and the second reservoir in communication with the seal-energizing cavity.

7. The apparatus of claim 6, wherein the first reservoir contains $CO_2$.

8. The apparatus of claim 6, wherein the second reservoir contains an incompressible fluid.

9. The apparatus of claim 8, wherein the incompressible fluid comprises oil or water.

10. The apparatus of claim 6, wherein the balancing cylinder comprises a vent hole which vents the second reservoir when the processing pressure exceeds the sealing pressure.

11. The apparatus of claim 10, wherein the vent hole is positioned so that when the processing pressure exceeds the sealing pressure by a threshold pressure, the piston slides to expose the second reservoir to the vent hole.

12. An apparatus for processing a semiconductor wafer, comprising:
   a. an upper element;
   b. a lower element, wherein the upper element and the lower element are brought together to form a processing volume;
   c. a means for sealing, wherein the means for sealing couples the upper element to the lower element to maintain the processing volume by generating a sealing force in a seal-energizing cavity to counterbalance a processing force generated within the processing volume; and
   d. a pressure intensifier, which intensifies a first pressure to produce a sealing pressure larger than the first pressure, the sealing pressure used to generate the sealing force.

13. A method of processing a workpiece, comprising:
   a. placing the workpiece within a first element;
   b. coupling the first element to a second element, thus forming a processing volume containing the workpiece, the processing volume defined by a plate that also defines a sealing cavity;
   c. processing the workpiece within the processing volume, thus generating a processing force within the processing volume; and
   d. maintaining the processing volume by generating a sealing force within the sealing cavity that forces the second element against the first element, the sealing force equal or approximately equal to the processing force.

14. The method of claim 13, wherein the step of processing comprises bringing a processing materials to a supercritical state.

15. The method of claim 14, wherein the processing material is $CO_2$.

16. The method of claim 13, further comprising the step of venting the processing volume when a processing pressure used to generate the processing force exceeds a sealing pressure used to generate the sealing force.

17. A method of processing a workpiece, comprising:
   a. placing the workpiece within a first element;
   b. coupling the first element to a second element, thus forming a processing volume containing the workpiece;
   c. processing the workpiece within the processing volume, thus generating a processing force within the processing volume; and
   d. maintaining the processing volume by generating a sealing force that forces the second element against the first element, the sealing force equal or approximately equal to the processing force, wherein maintaining the processing volume comprises intensifying a first pressure to produce a sealing pressure used to generate the sealing force.

18. The method of claim 17, wherein the step of intensifying the first pressure comprises:
   a. introducing a gas at the first pressure into a first volume having a first cross-sectional area;
   b. pressurizing the gas within the first volume to produce a first force;
   c. translating the first force to a second volume having a second cross-sectional area smaller than the first cross-sectional area, thereby producing the sealing force, larger than the first force.

19. The method of claim 18, further comprising the step of introducing a low-pressure material into the second volume.

20. The method of claim 19, wherein the low-pressure material comprises an incompressible fluid.

21. The method of claim 20, wherein the incompressible fluid comprises oil or water.

* * * * *

UNITED STATES PATENT AND TRADEMARK OFFICE
CERTIFICATE OF CORRECTION

| | |
|---|---|
| PATENT NO. | : 7,077,917 B2 |
| APPLICATION NO. | : 10/364284 |
| DATED | : July 18, 2006 |
| INVENTOR(S) | : William Dale Jones |

It is certified that error appears in the above-identified patent and that said Letters Patent is hereby corrected as shown below:

At column 3, line 64, please replace "HC1" with -- HCI --.

At column 15, line 41, please replace "C0$_2$" with -- CO$_2$ --.

Signed and Sealed this

Nineteenth Day of September, 2006

JON W. DUDAS
*Director of the United States Patent and Trademark Office*